(12) United States Patent
Omoumi et al.

(10) Patent No.: US 9,939,471 B1
(45) Date of Patent: Apr. 10, 2018

(54) POWER MEASUREMENT SYSTEM

(71) Applicant: Technology for Energy Corp., Knoxville, TN (US)

(72) Inventors: Kevin Christopher Omoumi, Cookeville, TN (US); Allen Vaughn Blalock, Louisville, TN (US)

(73) Assignee: Technology for Energy Corporation, Knoxville, TN (US)

( * ) Notice: Subject to any disclaimer, the term of this patent is extended or adjusted under 35 U.S.C. 154(b) by 133 days.

(21) Appl. No.: 14/872,118

(22) Filed: Sep. 30, 2015

Related U.S. Application Data

(60) Provisional application No. 62/057,758, filed on Sep. 30, 2014.

(51) Int. Cl.
*G01R 11/32* (2006.01)
*G01R 21/06* (2006.01)
*H03F 3/45* (2006.01)

(52) U.S. Cl.
CPC ......... *G01R 21/06* (2013.01); *H03F 3/45076* (2013.01); *H03F 2203/45116* (2013.01)

(58) Field of Classification Search
CPC .... G01R 15/09; G01R 19/0092; G01R 1/203; G01R 21/006; G01R 21/01; G01R 21/06; G01R 21/133; G01R 22/08; G01R 35/005; H03C 1/06; H03H 7/42; H03H 7/48; H02M 2001/0025; H02M 2001/0032; H02M 2001/0045; H02M 3/33515; H02M 3/33546; H02M 3/156; H02M 3/157; H02M 3/3376; H02M 3/1584; H02M 3/33507; H02M 7/53803; H03F 1/0211; H03F 2203/21103; H03F 2203/21106; H03F 2203/21139; H03F 2203/21142; H03F 3/211; H03F 1/22; H03F 1/301; H03F 1/3247; H03F 2200/15; H03F 2200/204; H03F 2200/207; H03F 2200/405; H03F 2200/435; H03F 2200/465;
(Continued)

(56) References Cited

U.S. PATENT DOCUMENTS 4,408,283 A * 10/1983 Kovalchik ........... G01R 21/127
324/142
5,153,510 A 10/1992 Kominsky
(Continued)

*Primary Examiner* — Vinh Nguyen
(74) *Attorney, Agent, or Firm* — Pitts & Lake, P.C.

(57) ABSTRACT

A power measurement system, including a voltage measurement circuit having a resistive network comprising first and second resistors connected in series on a first single substrate, and a feedback amplifier having an input in electrical communication with a point between the first and second resistors, and an output in electrical communication with the second resistor in a feedback configuration to output an attenuated voltage signal, and a transresistance current measurement circuit including a current transformer to transform an input primary current into a secondary current, a plurality of amplifiers configured in a cascading arrangement, and a feedback resistor configured in parallel with the cascaded amplifiers such that the combined gain of the cascaded amplifiers directs substantially all of the secondary current through the feedback resistor, wherein the system is selectively switchable between a voltage measurement mode and a current measurement mode.

15 Claims, 17 Drawing Sheets

(58) Field of Classification Search
CPC ......... H03F 2200/513; H03F 2200/555; H03F 2201/3212; H03G 3/004; H03G 3/007; H03G 1/0094; H02P 2209/07; H02P 6/085; H02P 7/29

See application file for complete search history.

(56) References Cited

U.S. PATENT DOCUMENTS

| | | | |
|---|---|---|---|
| 6,043,641 A * | 3/2000 | Singer | G01R 15/181 |
| | | | 324/115 |
| 6,070,058 A | 5/2000 | Waldroup et al. | |
| 6,194,910 B1 | 2/2001 | Davis et al. | |
| 6,603,301 B2 | 8/2003 | Beres | |
| 7,538,539 B1 | 5/2009 | Balke | |
| 7,615,988 B2 | 11/2009 | Blakely | |
| 8,143,880 B2 | 3/2012 | Vulovic et al. | |
| 9,654,054 B1 * | 5/2017 | Omoumi | H03K 5/02 |
| 2014/0253102 A1 | 9/2014 | Wood et al. | |
| 2014/0306690 A1 | 10/2014 | Hewson et al. | |

* cited by examiner

POWER MEASUREMENT SYSTEM

CROSS-REFERENCE TO RELATED APPLICATIONS

This application claims the benefit of U.S. Provisional Patent Application Ser. No. 62/057,758, filed on Sep. 30, 2014, the contents of which are incorporated herein in their entirety by reference.

FIELD OF INVENTION

The present general inventive concept relates to a system for measuring and analyzing electrical power, and, more particularly, to a cost-effective electrical power measurement system to selectively condition high and low ranges of analog signals and to measure a large dynamic range of input signals with high accuracy.

BACKGROUND

Field testing in the electric utility industry presents challenges in that extremely varying conditions such as temperature and other environmental conditions can have adverse effects on testing equipment. For example, the extreme range of temperatures that one may encounter in climates varying from sub-freezing temperatures in near polar areas to the sweltering temperatures found in other geographic regions have typically demanded that conventional measuring equipment include expensive components to handle wide ranging environmental and operational conditions. Such conventional configurations may also typically be difficult to transport and be quite heavy and bulky.

Several other of the many challenges in field testing, particularly in the area of current measurement, are due to the sheer differences in magnitude of current signals encountered. For example, a high current load in a factory is vastly different than a high current load in a residential home. Therefore, a device is needed that is capable of testing large ranges of current. However, care has to be taken in the design of measurement circuitry on the secondary side of a measurement device including a current transformer, due to the additional burden on the current transformer that is produced with any load-increasing components. Also, some conventional current measurement devices employ different circuits that must be selected by switching according to the level of current involved. Not only do these conventional circuits introduce too much burden on the secondary side of the current transformer, but data-loss incurred during the switching between the circuits results in losses of revenue from the companies supplying the power to the customers for whom the measurements are being taken. Thus, a device to measure current with a low secondary burden is desired, and one that minimizes losses when switching between different current ranges.

Thus, a sturdy and readily portable device to overcome these challenges, as well as other functions such as effective analog to digital conversion and other conditioning of the signals that are helpful in the analysis of the measured signals, is desired.

BRIEF SUMMARY

The present general inventive concept provides various embodiments of a compact power measurement device that is capable of being handheld to perform waveform analysis, the device including a voltage measurement circuit including a resistive network comprising first and second resistors connected in series on a first single substrate, and a feedback amplifier having an input in electrical communication with a point between the first and second resistors, and an output in electrical communication with the second resistor in a feedback configuration to output an attenuated voltage signal, and a transresistance current measurement circuit including a current transformer to transform an input primary current into a secondary current, a plurality of amplifiers configured in a cascading arrangement, and a feedback resistor configured in parallel with the cascaded amplifiers such that the combined gain of the cascaded amplifiers directs substantially all of the secondary current through the feedback resistor, wherein the handheld device is selectively switchable between a voltage measurement mode and a current measurement mode.

Additional features and embodiments of the present general inventive concept will be set forth in part in the description which follows, and, in part, will be obvious from the description, or may be learned by practice of the present general inventive concept.

Example embodiments of the present general inventive concept may be achieved by providing a power measurement system to perform waveform analysis, the system including a voltage measurement circuit (VMC) including a resistive network comprising first and second VMC resistors connected in series on a first single VMC substrate, the first VMC resistor having a resistance value larger than a resistance value of the second VMC resistor, the first VMC resistor being configured to receive an input voltage, and a first VMC feedback amplifier having an input in electrical communication with a point between the first and second VMC resistors, and an output in electrical communication with the second VMC resistor in a feedback configuration to output an attenuated VMC voltage signal, and a transresistance current measurement circuit (CMC) including a current transformer to transform an input primary current into a secondary current, a plurality of CMC amplifiers configured in a cascading arrangement, and a CMC feedback resistor configured in parallel with the cascaded amplifiers such that the combined gain of the cascaded CMC amplifiers directs substantially all of the secondary current through the CMC feedback resistor, wherein the system is selectively switchable between a voltage measurement mode and a current measurement mode.

The system may be further selectively switchable between high and low ranges in the voltage measurement mode, and between high and low ranges in the current measurement mode.

The first and second VMC resistors may be high-precision, low temperature coefficient (TC) resistors.

The system may further include a housing configured such that the first single VMC substrate and first and second resistors are exposed to an outside of the housing.

A resistance of the first VMC resistor may be at least an order of magnitude larger than a resistance of the second VMC resistor.

The plurality of CMC amplifiers may include a first and second operational amplifier, an inverting input of the first CMC amplifier may be in electrical communication with the current transformer, a non-inverting input of the second CMC amplifier may be in electrical communication with the output of the first CMC amplifier, a CMC output voltage signal may be supplied at an output of the second amplifier, and a value of the secondary current may be derived from the relationship of the CMC output voltage signal and resistive value of the CMC feedback resistor.

The system may further include a differential in/out amplifier circuit (DIOAC) to convert output signals from the DMC and/or AMC to positive, differential, anti-aliased signals implemented on a dc reference voltage at the middle of an analog to digital converter (ADC) power supply voltage to be transmitted to an ADC.

The DIOAC may include a DIOAC negative voltage input, a DIOAC positive voltage input, a DIOAC positive voltage output, a DIOAC negative voltage output, a first DIOAC amplifier having an output in electrical communication with the DIOAC positive voltage output, a first DIOAC resistor in electrical communication with the DIOAC negative voltage input, a second DIOAC resistor in electrical communication with the first DIOAC resistor and the DIOAC positive voltage output, a third DIOAC resistor in electrical communication with the DIOAC positive voltage input, a fourth DIOAC resistor in electrical communication with the third DIOAC resistor and the DIOAC negative voltage output, wherein the first, second, third, and fourth DIOAC resistors may be formed on a first single DIOAC substrate.

The first and third DIOAC resistors may have substantially the same resistance value, and the second and fourth DIOAC resistors may have substantially the same resistance value.

The DIOAC negative voltage input may receive the VMC output voltage signal, and the DIOAC positive voltage input may be in electrical connection with a ground of the VMC, when the system is in the voltage measurement mode, and the DIOAC negative voltage input may receive the AMC output voltage signal, and the DIOAC positive voltage input may be in electrical connection with a ground of the AMC, when the system is in the current measurement mode.

The DIOAC may further include a second DIOAC amplifier having an output in communication with the DIOAC negative voltage output, a baseline voltage input in electrical communication with a positive input of the second DIOAC amplifier, a fifth DIOAC resistor in electrical communication with the DIOAC negative voltage output and a negative input of the second DIOAC amplifier, and a sixth DIOAC resistor in electrical communication with the DIOAC positive voltage output and the negative input of the second DIOAC amplifier, wherein the fifth and sixth DIOAC resistors are formed on a second single DIOAC substrate.

The DIOAC may further include a differential low-pass signal filter to minimize anti-aliasing distortion in downstream ADC operation, the low-pass signal filter including a first DIOAC capacitor in electrical communication with, at a first side, a ground of the DIOAC, and with, at a second side, a point between the first and second DIOAC resistors, a second DIOAC capacitor in electrical communication with, at a first side, a negative input of the first DIOAC amplifier, and, at a second side, the DIOAC positive voltage output, a seventh DIOAC resistor in electrical communication with, at a first side, the first DIOAC capacitor and the point between the first and second DIOAC resistors, and with, at a second side, the second DIOAC capacitor and the negative input of the first DIOAC amplifier, a third DIOAC capacitor in electrical communication with, at a first side, the ground of the DIOAC, and with, at a second side, a point between the third and fourth DIOAC resistors, a fourth DIOAC capacitor in electrical communication with, at a first side, a positive input of the first DIOAC amplifier, and, at a second side, the DIOAC negative voltage output, and an eighth DIOAC resistor in electrical communication with, at a first side, the third DIOAC capacitor and the point between the third and fourth DIOAC resistors, and with, at a second side, the fourth DIOAC capacitor and the positive input of the first DIOAC amplifier, wherein the first and third DIOAC capacitors may have substantially the same capacitance values, the second and fourth DIOAC capacitors may have substantially the same capacitance values, and the seventh and eighth DIOAC resistors may have substantially the same resistance values.

The system may further include an analog to digital converter (ADC).

The system may further include a housing, a plurality of user inputs to enter operation requests and/or data, at least one display screen to display operation modes, operation results, stored/generated data, requests for information, or any combination thereof, and a plurality of connection ports to connect the system with one or more other auxiliary devices.

The connection ports may include three pairs of inputs to connect to another device to acquire three-phase voltage and/or current signals.

The connection ports may include a plurality of USB ports.

Example embodiments of the present general inventive concept may be achieved by providing a differential in/out amplifier circuit to convert received voltage signals to positive, differential signals to be transmitted to an analog to digital converter (ADC), the amplifier circuit including a negative voltage input, a positive voltage input, a positive voltage output, a negative voltage output, a first amplifier having an output in electrical communication with the positive voltage output, a first resistor in electrical communication with the negative voltage input, a second resistor in electrical communication with the first resistor and the positive voltage output, a third resistor in electrical communication with the positive voltage input, a fourth resistor in electrical communication with the third resistor and the negative voltage output, wherein the first, second, third, and fourth resistors are formed on a first single substrate.

The first and third resistors may have substantially the same resistance value, and the second and fourth resistors may have substantially the same resistance value.

The amplifier circuit may further include a second amplifier having an output in communication with the negative voltage output, a baseline voltage input in electrical communication with a positive input of the second amplifier, a fifth resistor in electrical communication with the negative voltage output and a negative input of the second amplifier, and a sixth resistor in electrical communication with the positive voltage output and the negative input of the second amplifier, wherein the fifth and sixth resistors are formed on a second single substrate.

The system may further include a differential low-pass signal filter to minimize anti-aliasing distortion in downstream ADC operation, the low-pass signal filter including a first capacitor in electrical communication with, at a first side, a ground of the amplifier circuit, and with, at a second side, a point between the first and second resistors, a second capacitor in electrical communication with, at a first side, a negative input of the first amplifier, and, at a second side, the positive voltage output, a seventh resistor in electrical communication with, at a first side, the first capacitor and the point between the first and second resistors, and with, at a second side, the second capacitor and the negative input of the first amplifier, a third capacitor in electrical communication with, at a first side, the ground of the amplifier circuit, and with, at a second side, a point between the third and fourth resistors, a fourth capacitor in electrical communication with, at a first side, a positive input of the first amplifier, and, at a second side, the negative voltage output, and an eighth resistor in electrical communication with, at a first side, the third capacitor and the point between the third and fourth resistors, and with, at a second side, the fourth capacitor and the positive input of the first amplifier, wherein the first and third capacitors have substantially the same capacitance values, the second and fourth capacitors have substantially the same capacitance values, and the seventh and eighth resistors have substantially the same resistance values.

The negative voltage input may receive an output voltage signal of a voltage signal providing circuit, and the positive voltage input is in electrical connection with a ground of the voltage signal providing circuit.

Other features and embodiments of the present general inventive concept may be apparent from the following detailed description, the drawings, and the claims.

BRIEF DESCRIPTION OF THE FIGURES

The following example embodiments are representative of example techniques and structures designed to carry out the objects of the present general inventive concept, but the present general inventive concept is not limited to these example embodiments. In the accompanying drawings and illustrations, the sizes and relative sizes, shapes, and qualities of lines, entities, and regions may be exaggerated for clarity. A wide variety of additional embodiments will be more readily understood and appreciated through the following detailed description of the example embodiments, with reference to the accompanying drawings in which.

DETAILED DESCRIPTION

Figures 1A, 1B:
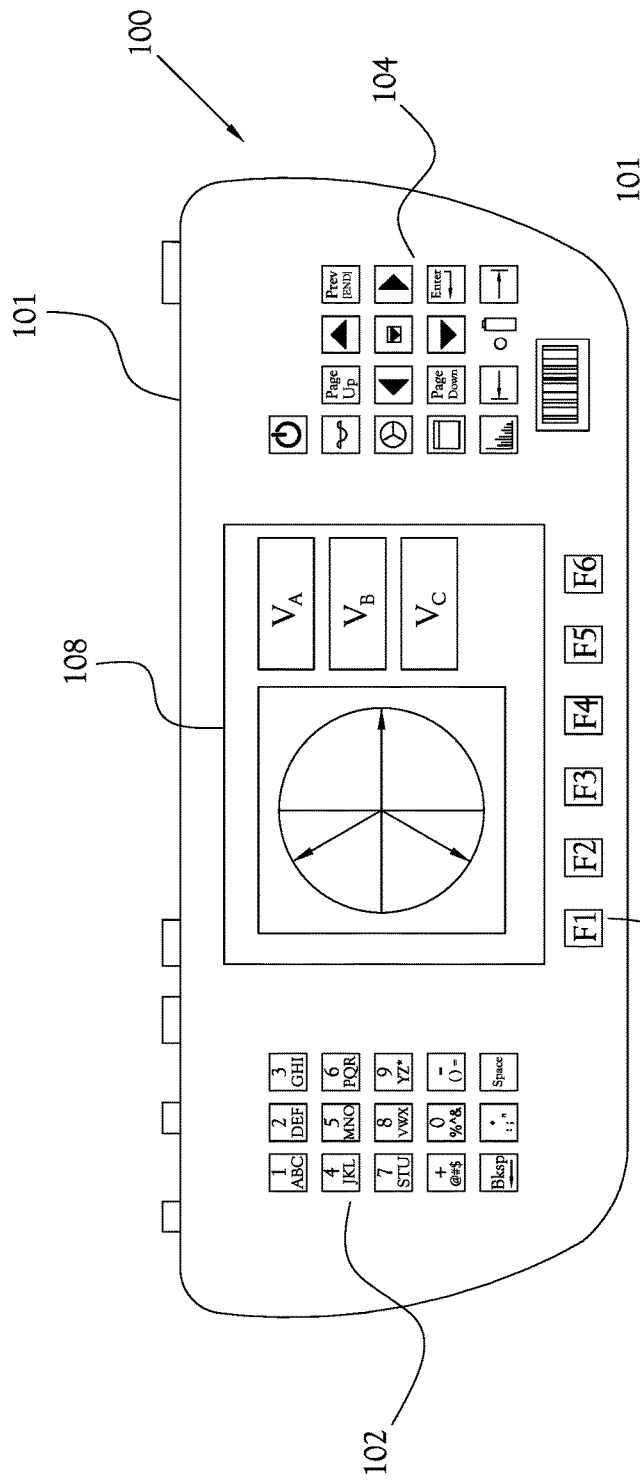
FIGS. 1A-1B illustrate an example embodiment of a handheld field testing device for the electric utility industry according to the present general inventive concept.

Reference will now be made to the example embodiments of the present general inventive concept, examples of which are illustrated in the accompanying drawings and illustrations. The example embodiments are described herein in order to explain the present general inventive concept by referring to the figures.

The following detailed description is provided to assist the reader in gaining a comprehensive understanding of the structures and fabrication techniques described herein. Accordingly, various changes, modification, and equivalents of the structures and fabrication techniques described herein will be suggested to those of ordinary skill in the art. The progression of fabrication operations described are merely examples, however, and the sequence type of operations is not limited to that set forth herein and may be changed as is known in the art, with the exception of operations necessarily occurring in a certain order. Also, description of well-known functions, electrical components, and constructions may be simplified and illustrated as equivalent circuits and/or omitted for increased clarity and conciseness.

Note that spatially relative terms, such as "up," "down," "right," "left," "beneath," "below," "lower," "above," "upper" and the like, may be used herein for ease of description to describe one element or feature's relationship to another element(s) or feature(s) as illustrated in the figures. Spatially relative terms are intended to encompass different orientations of the device in use or operation in addition to the orientation depicted in the figures. For example, if the device in the figures is turned over or rotated, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

As used herein, the term "resistor" may refer to an embodiment of a resistive element with a precisely designed opposition to the passage of electric current, as commonly used in the electronics industry and which would be readily recognized as a typical circuit component by one of ordinary skill in the art.

As used herein, the term "temperature coefficient of resistance" (TCR) may refer to the following relationship:

$$TCR = \frac{R2 - R1}{R1 \cdot (T2 - T1)} \cdot 10^6$$

In the equation shown above, TCR is the rate of change of resistance for a resistive element specified in ppm/° C., where R1 is the resistance in ohms at a reference room temperature, R2 is the resistance in ohms at a specific operating temperature, T1 is the reference room temperature in ° C., and T2 is the specific operating temperature in ° C., as commonly used in the electronics industry and which would be readily recognized as a typical resistor attribute by one of ordinary skill in the art.

As used herein, the term "high precision" resistor may refer to a resistor typically classified as EIA E192 (accuracy class 0.1% or better) with low TCR (±25 ppm/° C. or better), as commonly used in the electronics industry and which would be readily recognized as a typical resistor attribute by one of ordinary skill in the art.

As used herein, the term "low precision" resistor may refer to a resistor classified as EIA E24 or lower (accuracy class 5% or worse) with typical TCR of (±500 ppm/° C. or worse), as commonly used in the electronics industry and which would be readily recognized as a typical resistor attribute by one of ordinary skill in the art.

As used herein, the term "resistor array" may refer to multiple resistive elements (e.g., resistors) simultaneously manufactured on a common thermally connected and conductive substrate such that the individual resistive elements maintain substantially the same tracking relation, initially and over temperature, said tracking relation between elements being stable within a percentage difference smaller than the percent difference between the absolute resistance value of each element and the manufacturers' nominal specified value. In the case of low precision arrays the inter-element tracking percentage difference may be at least 2 orders better than the specified tolerance of the nominal resistance value.

As used herein, the term "op-amp" may refer to the embodiment of an ideal transistor circuit with a differential input (two inputs of opposite polarity), infinite input impedance, infinite open-loop gain, infinite bandwidth and zero noise, with a single output having zero output impedance, and typically available as a pre-manufactured integrated circuit. Op-amps may be combined with other electronic components to implement scaling transfer functions of less than unity (attenuator), greater than unity (amplifier), or unity (isolating buffer), in addition to other mathematical and utility operations on signals, as is commonly used in the electronics industry and which would be readily recognized as a typical electronic circuit component by one of ordinary skill in the art.

As used herein, the term "equivalent resistances" may refer to resistors having specified nominal values which would produce a ratio of unity if the resistances were ideal (i.e., zero error between the nominal specified and absolute resistance values), as is commonly used in the electronics industry and which would be readily recognized as a typical electronic circuit attribute by one of ordinary skill in the art.

As used herein, the term "sensitivity" may refer to a quantity specified by the amount of change in the output signal of a module due to at least one received input signal of that module. Effectively, the sensitivity is the ratio of the output signal of a given module divided by at least one input signal of the same module such that the sensitivity is substantially equivalent to a transfer function, gain, or attenuation of that module.

As used herein, the term "module" may refer to a portion of a circuit containing various electrical components to act on one or more signals. Different modules of a same circuit described herein may have one or more overlapping portions with other described modules.

As used herein, the term "condition" may refer to one or more changes to one or more attributes of an input signal, such that the "conditioned" output signal has the one or more changed attributes.

As used herein, the term "magnitude" may refer to the absolute value of a signal characteristic, such that the characteristic has a positive value whether the signal is in a positive or negative state.

It is noted that several of the example embodiments described herein may refer to voltage or current as the input and/or output signals being conditioned, measured, and so on. However, the conditioning methods and circuits described herein are not limited to either voltage or current, but rather are capable of conditioning and/or measuring a plurality of types of signals. Also, while the terms "resistor", "resistive elements", etc., are typically used in the following description, it is understood that such terms are interchangeable with "impedance" in the present general inventive concept.

Various example embodiments of the present general inventive concept exploit a characteristic of low precision resistor arrays to condition analog signals, such as voltage levels, with high precision. Low precision resistor arrays, e.g., ±5% or worse tolerance, are readily available at very low cost in values up to $10^7$ ohms. High precision resistor arrays, e.g., ±0.5% or better tolerance, are readily available in resistive values only up to about $10^5$ ohms or less, and are typically more than an order of magnitude more expensive than low precision arrays.

One specific characteristic of resistor arrays exploited by various example embodiments of the present general inventive concept is that the tracking between resistor element values of low precision arrays is typically very close, initially and over temperature. Despite a large percentage difference between the absolute resistance value of each element and the manufacturers' nominal specified value, low precision resistor array elements commonly exhibit tracking differences between individual elements that are often 2 orders of magnitude smaller. The present inventive concept exploits this small percent difference in tracking to provide a conditioned signal fidelity of a comparably small percent error. This is accomplished using low cost high resistance value resistor arrays with absolute uncertainties much larger than the attained signal accuracy.

One example embodiment of the present general inventive concept is a precision active analog signal conditioning circuit that operates over a plurality of orders of magnitude of input signal amplitudes and/or operating temperatures to produce a signal conditioning accuracy on the order of the matching accuracy of the impedances of a plurality of electrical elements manufactured on the same thermally conductive substrate without requiring adjustment for errors initially and/or over temperature.

According to various examples of the present general inventive concept, a signal conditioning circuit is provided that is switchable between high and low value signal ranges. In various example embodiments of the present general inventive concept, a signal conditioning device having such circuitry may be configured as a handheld analyzer.

According to various examples of the present general inventive concept, a waveform analyzer is provided that is switchable between high and low value waveforms. In various example embodiments of the present general inventive concept, the waveform analyzer may be configured as a handheld analyzer.

FIGS. 1A-1B illustrate an example embodiment of a handheld field testing device for the electric utility industry according to the present general inventive concept. Various example embodiments of the handheld field testing device 100 may include one or more of the circuits discussed herein used to analyze voltage, current, and/or other aspects associated with electric utilities. While the term "analyze" may be used herein when describing such devices and circuitry, it is understood that such a term may encompass various aspects of signal analysis, such as measurement, which in turn may encompass various types of conditioning, such as signal amplification to change the level of a signal to a more manageable value for, for example, measurement of the signal.

It is understood that the device 100 illustrated in FIG. 1 is merely an example embodiment configured with components to perform one or more of the analyses and/or processes described herein. However, it is understood that the present general inventive concept is not limited to any of the specific elements and/or configurations shown in this or other example embodiments in this description. The drawings described herein include several example embodiments of circuits and equivalent circuits that may be features in the device 100, or a differently configured device according to the present general inventive concept. Such a device may be battery powered, and/or may include an auxiliary power connection.

Several aspects and features of the analog "front-end" circuit designs according to various example embodiments of the present general inventive concept and described herein are either novel outright or, at least, novel as applied within a power standard for the electric power industry. One advantage of such an instrument is to provide power utility companies a cost-effective means of verification of power meters at power customer load points all over the world, regardless of the climate and various other conditions.

The example embodiment of the handheld field testing device 100 illustrated in FIGS. 1A-1B has a housing 101 that includes a face portion illustrated in FIG. 1A, and a connectivity portion illustrated in FIG. 1B. In the example embodiment illustrated in FIGS. 1A-1B, the face portion and connectivity portion are configured as adjacent surfaces, but it is understood that the present general inventive concept is not limited to such a configuration. For example, the connectivity portion of the device 100 may be configured to be opposite to the face portion, and so on. Further, although various user interactivity features and components are illustrated as being provided on and/or through the face portion of the device 100 in FIG. 1A, it is understood that the illustrated features and/or components may be provided at a plurality of surfaces, sides, etc., of the device 100 according to various example embodiments of the present general inventive concept.

The example embodiment of the face portion of the device 100 of FIG. 1A includes a plurality of user interface keys used to input data, control functionality, etc. The user interface keys may be configured in a variety of ways, such as mechanical buttons, heat or pressure sensors, and so on. In the example embodiment illustrated in FIG. 1A, the user interface keys include an alphanumeric key set 102 used to enter various characters related to data input, and to control an associated curser (space, backspace, etc.), an operational key set 104 used to control various operations of the device 100, and a functional key set 106 used to choose various functions of the device 100. The device 100 of the example embodiment illustrated in FIG. 1A also includes a display 108 to display alphanumeric and/or graphic results of various processes, fields of data entry, and so on. For example, in the embodiment illustrated in FIG. 1A, the display 108 is displaying a vector diagram associated with a three-phase voltage analysis operation. Such a display may include any of a number of values associated with such an operation, and has been simplified in FIG. 1A for ease of understanding.

The example embodiment of the connectivity portion of the device 100 of FIG. 1A includes a plurality of connection ports to connect the handheld device 100 with one or more other devices. Although not illustrated, the handheld device 100 may also be configured to communicate wirelessly by including one or more wireless communication transceivers to communicate in a standard such as W-Fi, Bluetooth®, etc. The connection ports may include, for example, direct inputs for AC current, AC voltage, and auxiliary power, various probe inputs, and various other connections such as pulse inputs and pulse outputs, USB ports for peripheral devices and/or connectivity to a PC, an RS232 port for legacy devices, and so on. The example embodiment illustrated in FIG. 1B includes direct inputs 110 for three-phase input of AC current, direct input $110_V$ for voltage, an RS232 port 120, and a plurality of USB ports 130, as well as other connections such as those discussed above.

Various example embodiments of the handheld device 100 provide a compact handheld design having a low weight, such as, for example, approximately 3.5 pounds, that is capable of protecting revenue in the electric utility industry by performing a host of functions such as diagnosing metering site errors. Example embodiments of the device 100 to perform waveform analysis include an ultra-compact, handheld field instrument with a true three-phase analyzing reference standard that performs various metering site accuracy tests, and operates under actual customer load conditions so a true representation of site accuracy can be verified. Various operations such as, for example, meter testing, CT/PT ratio testing, CT/PT burden measurement, register/demand testing, wiring verification, as well as other operations are all easily performed with the handheld device 100. Various example embodiments of the handheld device 100 may include the three-phase reference standard and may display vector diagrams, voltage and current waveforms, harmonic analysis up to $50^{th}$ harmonic, meter testing, and register/demand testing. Various example embodiments may include meter site manager software. Various example embodiments may include direct inputs 110, 110v that are rated from 1 mA to 20 A RMS and 20 mV to 600V RMS respectively, may include CT and PT ratio testing, and CT and PT burden measurement. Various example embodiments may include one or two sets of three probe inputs, wherein resolution and range are determined by probe. Various example embodiments may include an auxiliary power connection having 1 input rated 120 to 240 VAC. The pulse inputs may include a meter pulse input and standard input, and the pulse outputs may include a standard output. Various example embodiments may have a display resolution of 640×480, full color transmissive VGA, LED backlit, with a display size of approximately 5.7 inches. The operating temperature for various example embodiments of the device may be −20 degrees Celsius to 50 degrees Celsius, with a storage temperature of −30 degrees Celsius to 60 degrees Celsius, and in a non-condensing humidity of 0 to 95%. Various example embodiments may include an 11.1V Li-Ion rechargeable, 2600 mAh internal battery. Various example embodiments may have dimensions of approximately 11.6 in×6.2 in×2.0 in. The measurement category of the device 100 may be CAT IV 600V. Various example embodiments of the device 100 may measure energy in Wh, VARh, and Vah with a ±0.05% accuracy with direct current channels and ±0.10% accuracy with probe channels, power in Watt, VAR, and VA with a ±0.05% accuracy with direct current channels and ±0.10% accuracy with probe channels, and have a power factor of −1.00 to 1.00. As previously discussed, various example embodiments may measure harmonics in a user selectable fashion up to 50th harmonic.

Some of the various design goals that compel the novelty of the present general inventive concept are an optimum combination of high measurement accuracy over temperature and time; long run time (i.e., long battery life); low cost manufacture; rapid factory calibration; small physical size; ease of use; robustness in the field; as well as other similar factors both known to one skilled in the art and that may arise during manufacture and/or implementation.

Figure 2:
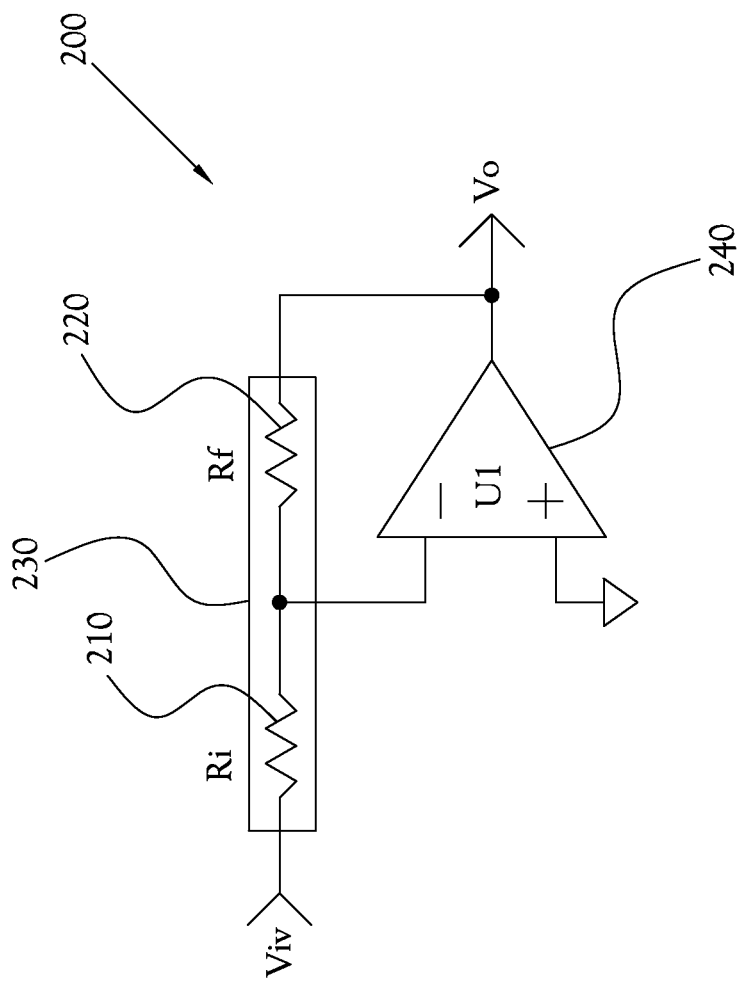
FIG. 2 illustrates an active inverting precision attenuator that measures voltage in the electric power standard according to an embodiment of the present general inventive concept.

FIG. 2 illustrates an active inverting precision attenuator that measures voltage in the electric power standard according to an embodiment of the present general inventive concept. The configuration of the example embodiment illustrated in FIG. 2 is well suited for measuring large voltages from high-power distribution systems, and such a circuit may be used in several example embodiments such as a dedicated voltage measuring device, within the waveform analyzer of FIG. 1 to measure large voltages from high-power distribution systems, and so on. In the circuit 200 of the example embodiment illustrated in FIG. 2, a voltage Viv is converted to a smaller, more manageable voltage Vo that is easier for modern low-power, low-voltage electronic circuits to digitize with precision. The circuit 200 of this example embodiment is a novel means for precise voltage waveform attenuation for measurement of high voltages, in particular voltages from electric power systems. However, it is noted that the example embodiment illustrated in FIG. 2 is not restricted to high voltage applications, and may be used for a large range of voltages as desired by the user.

Referring to the example embodiment circuit 200 illustrated on FIG. 2, Ri 210 and Rf 220 may be high-precision, low temperature coefficient (TC) resistors fabricated on the same substrate 230, thus forming a single passive component. This single passive component may be designed to have a low absolute temperature coefficient of resistance (TCR) and, due to fabrication on a single substrate, also has a strong isothermal connection between the two resistances. In other words, Ri 210 and Rf 220 may be very well thermally connected, so as to react in similar ways to changes in temperature, current, etc., and therefore substantially maintain the ratio of their resistive values. The two resistances may be fabricated simultaneously in a process which yields a small tolerance absolute resistance ratio and similar magnitude and direction (sign) TCR or tracking TCR. Essentially, the ratio of Rf 220 and Ri 210 changes very little with temperature. In various example embodiments of the circuit 200 illustrated in FIG. 1, the resistance of Ri 210 may be very large relative to the resistance of Rf 220, and the large resistance of Ri 210 adds robustness to the circuit 200 by limiting the possible current. In various example embodiments of the present general inventive concept, the resistive elements 210,220 formed on the substrate 230 may be the only part of the circuit 200 exposed to the outside world. For example, the circuit 200 may be provided in a housing (not illustrated), and the resistors Ri 210 and Rf 220, along with at least a portion of the substrate on which Ri 210 and Rf 220 are provided, may be exposed to the outside of the housing.

In general, voltage attenuation in the example embodiment circuit 200 of FIG. 2 may be produced by Ri 210 having orders of magnitude larger resistance than Rf 220. This type of resistor network or array is typically used as a precision attenuator in a passive voltage divider configuration. In the example embodiment circuit 200 illustrated in FIG. 2, attenuation is instead achieved through the use of the tracking Ri 210 and Rf 220 network connected to a high open-loop gain, monolithic voltage feedback amplifier (VFA) U1 240, in an inverting closed-loop gain configuration. In an example embodiment of the present general inventive concept, Ri 210 may have a resistance of approximately 10 megaohms, while Rf 220, which acts as a feedback resistor for the amplifier U1 240, may have a resistance of approximately 100 ohms.

Any voltage, Viv, applied to the example embodiment circuit 200 illustrated in FIG. 2 will produce an electrical current flowing through Ri 210. The negative feedback of the circuit configuration and the high open-loop gain of U1 240 forces any current in Ri 210 to also flow through Rf 220. Since the gain of U1 240 is large, the voltage between its (−) and (+) terminals will remain virtually zero. According to various example embodiments of the present general inventive concept, virtually zero in this sense may mean several orders of magnitude smaller than the U1 240 output voltage, Vo, illustrated in FIG. 2. The voltage Vo becomes Viv scaled by the resistance ratio Rf/Ri which, as explained above, will change very little over changes in temperature. As a result of the inverting configuration, the phase of Vo will be shifted 180° from that of Viv since the current in Rf 220 is equal to the current in Ri 210 and the U1 240 (−) terminal is held to zero volts.

Figure 3:
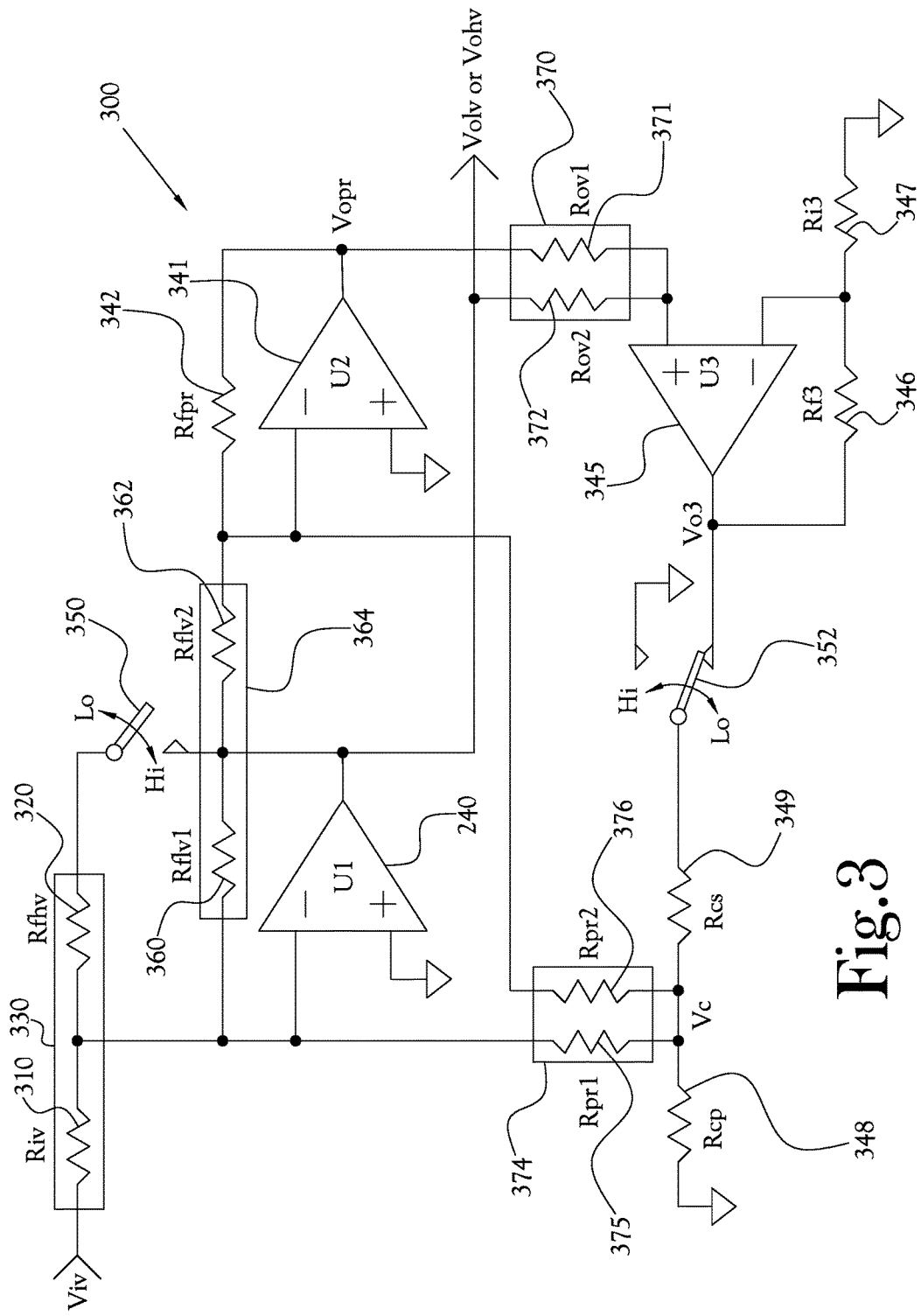
FIG. 3 illustrates a circuit for dual range voltage measurement that uses a novel low range precision correction circuit according to an embodiment of the present general inventive concept.

FIG. 3 illustrates a circuit for dual range voltage measurement that uses a novel low range precision correction circuit according to an embodiment of the present general inventive concept. The example embodiment circuit 300 illustrated in FIG. 3 incorporates the active inverting precision attenuator illustrated in FIG. 2 to precisely measure large input voltages, Viv. Resistors Riv 310 and Rfhv 320 of the circuit illustrated in FIG. 3 are equivalent to resistors Ri 210 and Rf 220 of the circuit 200 illustrated in FIG. 2, respectively. Mode selection switches 350 and 352 of the circuit 300 illustrated in FIG. 3, which may be switched to convert between high and low voltage analysis, when set to a state opposite of that illustrated in FIG. 3 (i.e., when set to the "Hi" position) will result in operation as a precision attenuator of Viv to accurately produce a high-range output voltage, Vohv, orders of magnitude smaller than Viv when Viv is an extremely high voltage.

In the example embodiment illustrated in FIG. 3, resistors Rflv1 360 and Rflv2 362, which may be formed on the same single substrate 364, have higher resistive values than Rfhv 320. Mode selection switches 350 and 352, when set to the state shown in the circuit 300 illustrated in FIG. 3 (i.e., set to the "Lo" position), change the effective size of Rf 220 of the circuit 200 illustrated in FIG. 2 to a much larger resistance, Rflv1 360, in order to produce orders of magnitude less attenuation of the input voltage, Viv. This allows measurement of orders of magnitude smaller input voltages at Viv, and results in a low-range output voltage, Volv.

Additional circuitry illustrated in FIG. 3 may be used to increase the accuracy of the low-range measurement without using prohibitively expensive components for the large value resistors, Rflv1 360 and Rflv2 370, with high precision comparable to the Riv 310 and Rfhv 320 resistor array. It can be very difficult and expensive to fabricate a large resistance value, matched resistors network with high precision and small temperature coefficient as compared to smaller resistance value, high-precision parts such as the Rov 370 and Rpr 374 networks of the example embodiment illustrated in FIG. 3, and which will be discussed in more detail herein. As illustrated in FIG. 3, according to various example embodiments of the present general inventive concept, the resistance network 370 may include resistive elements Rov1 371 and Rov2 372 provided on a single substrate, and the resistance network 374 may include resistive elements Rpr1 375 and Rpr2 376 formed on a single substrate.

Figure 4:
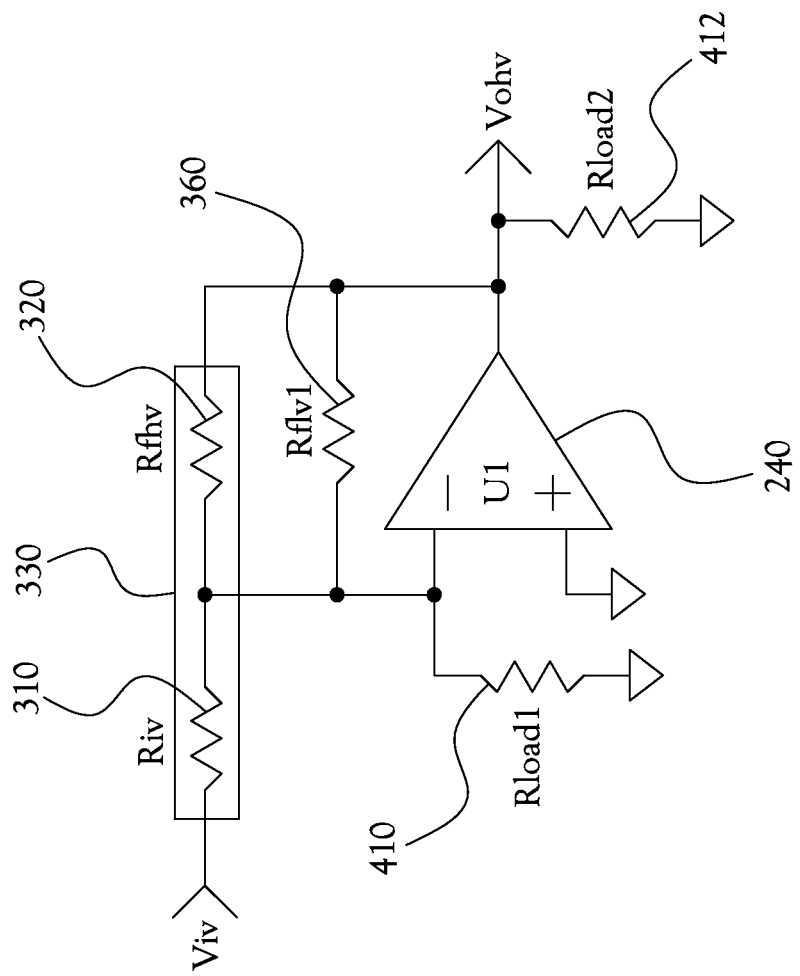
FIG. 4 illustrates an equivalent circuit of the dual range voltage measurement circuit illustrated in FIG. 3 with mode selection switches set in a high range position to create an active inverting precision attenuator according to an example embodiment of the present general inventive concept.

FIG. 4 illustrates an equivalent circuit of the dual range voltage measurement circuit illustrated in FIG. 3 with mode selection switches 350 and 352 set in a high range position to create an active inverting precision attenuator according to an example embodiment of the present general inventive concept. The example embodiment illustrated in FIG. 4 shows the equivalent circuit that results when the mode selection switches 350 and 352 of the circuit illustrated in FIG. 3 are set in the high range position, as opposed to the low range position configuration illustrated in FIG. 3. As indicated, this configuration produces a high-range voltage attenuation operation. The example embodiment circuit illustrated in FIG. 4 depicts the equivalence of the high-range attenuation circuit to the active inverting precision attenuator of the example embodiment circuit 200 illustrated in FIG. 2.

Referring to FIG. 4, the load resistances Rload1 410 and Rload2 412 represent connected, but otherwise unused, low-range circuitry when the example embodiment dual range voltage measurement circuit 300 is operating in the high-range operating mode. These resistances are easily made large enough so that there are substantially no effects upon the high-range operation mode or the precision of the Viv measurement. Note that the resistance Rflv1 360 connected in parallel with the resistance Rfhv 320 has little to no effect upon the net feedback resistance Rfn of U1 240, since the resistance Rflv1 360 of this example embodiment is orders of magnitude larger than Rfhv 320, essentially rendering the feedback resistance Rfn equal to the precision resistance Rfhv 320. According to various example embodiments of the present general inventive concept, the output voltage Vohv may be orders of magnitude smaller than the input voltage Viv due to the configuration of the resistor array Riv 310 and Rfhv 320 provided on the single substrate 330.

Figure 5:
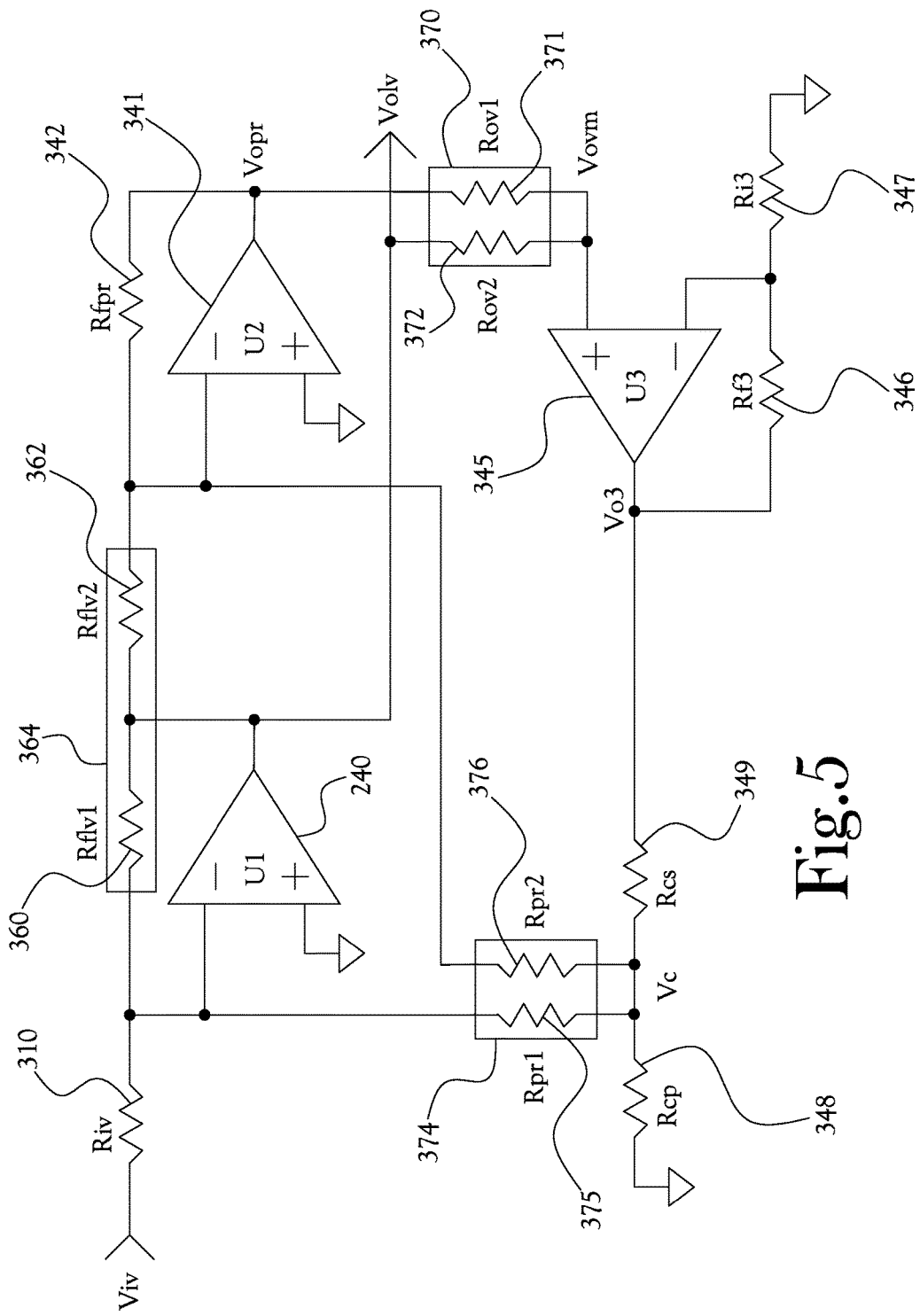
FIG. 5 illustrates an equivalent circuit of the dual range voltage measurement circuit illustrated in FIG. 2 with mode selection switches set in a low range position to create an active inverting precision attenuator according to an example embodiment of the present general inventive concept.

FIG. 5 illustrates an equivalent circuit of the dual range voltage measurement circuit illustrated in FIG. 2 with mode selection switches set in a low range position to create an active inverting precision attenuator according to an example embodiment of the present general inventive concept. The equivalent circuit resulting from the mode selection switch 350,352 settings in the positions illustrated in FIG. 2 produces the low range operation mode. The resulting circuit is illustrated in FIG. 5. This example embodiment of the present general inventive concept illustrates a novel correction circuit that uses lower cost parts, such as the Rflv1 360 and Rflv2 362 resistor network, to attain accuracy in lieu of a significantly more expensive precision low TCR network, such as the previously described Riv 310 and Rfhv 320 network used in the high range operation mode. These resistances are implemented instead with a large value resistance network, i.e., the Rflv1 360 and Rflv2 362 resistor network, that is about 2 orders of magnitude less expensive because the network exhibits a relatively large absolute tolerance and temperature coefficient of resistance. However, as these parts may also be fabricated as an array or network on the same substrate 364 in various example embodiments of the present general inventive concept, they may exhibit much better than rated initial tolerances and temperature coefficients (commonly referred to as drift) between resistances of any single part than between resistances of separate parts. Essentially, the close tracking between resistances of individual networks initially and over temperature can be utilized to create a gain-stabilized output signal. Although the Rflv1 360 and Rflv2 network are illustrated as two resistive elements in FIG. 5, in various example embodiments of the present general inventive concept either or both of these resistive elements may be represented by two or more resistive elements connected in series and/or parallel to more accurately achieve the desired and/or rated initial tolerances of these less expensive and less precision components. According to various example embodiments of the present general inventive concept, various other components may be provided to improve the accuracy of the low range voltage attenuation, including an amplifier U2 341 and corresponding feedback resistor Rfpr 342, amplifier U3 345 and corresponding feedback resistor Rfc 346, resistance network 370 including resistive elements 371 and 372, and resistance network 374 including resistive elements 375 and 376. These and other components will be discussed in more detail herein.

In various example embodiments, the attenuation in the low range mode may be orders of magnitude lower than the attenuation in the high range mode. For example, in various example embodiments of the present general inventive concept illustrated in FIG. 5, the dual range voltage measurement circuit may only attenuate the input voltage Viv to half the input value at the output voltage Volv.

The example embodiment low-range voltage measurement equivalent circuit illustrated in FIG. 5 corrects for large absolute and drift inaccuracies of Rflv1 360 and Rflv2 362. The output voltage Vopr of amplifier U2 341, which receives a signal from amplifier U1 240 through Rflv2 362 as well as from resistor network 374 to which is applied a correction voltage Vc, responds to the input voltage Viv in substantially the same manner regardless of the resistance values of Rflv1 360 and Rflv2 362 to the extent their resistance values are substantially equal. Voltage Vopr does not respond to the voltage Vc to the extent that Rflv1 360 is substantially equal to Rflv2 362 and Rpr1 375 is substantially equal to Rpr2 376. Rpr1 375 and Rpr2 376 may be part of a much less expensive, smaller-value precision resistance array. Consequently, voltage Vopr is a much more accurate attenuated measure of input voltage Viv, because it is produced from much more precise resistance value ratios. The trade-off is that the magnitude of voltage Vopr is smaller than that of voltage Volv, the larger magnitude being used for more optimum downstream digitization. Unlike voltage Vopr, voltage Volv does, however, respond to the voltage Vc. Consequently, negative feedback and large voltage gain from amplifier U3 345 will force voltage Vc to whatever level is necessary to trim the output signal voltage Volv larger than Vopr by the factor of precision resistor network Rov2/Rov1.

Choosing the ratio Rov2/Rov1 of resistance values within the second smaller value precision resistance array to equal the ratio of ideal Rflv1/Rfpr will result in the output signal voltage Volv being adjusted to that which would be produced if the value of Rflv1 was equal to its nominal or ideal resistance value. This will occur within the accuracy of the smaller value precision resistors. Note that Rfpr is a single high precision, low TCR resistor with a value Rov2/Rov1 times smaller than the ideal value of resistor Rflv1 and therefore again less expensive.

The low-range voltage measurement and correction circuit utilizes negative feedback in multiple locations within the circuit. Performance of various example embodiments of the present general inventive concept may be improved in cases in which the feedback loops are engineered for optimum speed and stability for proper function and minimum noise superposition onto the output signal voltage, Volv. Such engineering is non-trivial as it comprises a strategic combination of experiment and theoretical analysis. That work is beyond the scope of this disclosure and is not described here.

While the previously described illustrations in FIGS. 2-5 referred to descriptions of example embodiments of electronic voltage measurement components and techniques according to the present general inventive concept, the descriptions and drawings herein will now turn to descriptions of example embodiments of electronic current measurement components and techniques according to the present general inventive concept.

Current transformer (CT) devices are ubiquitous within electric power distribution systems. Such devices are often used to measure very large electrical currents, and the suitability of CT devices for these measurements is their primary advantage. The secondary current of a CT is ideally the primary current divided by the ratio of the secondary winding turns to the primary winding turns. Typically the secondary current of a CT is measured by connecting a resistor of a few ohms across (in series with) the secondary winding and measuring the resulting voltage developed across the resistance with a voltmeter or other voltage measuring means. This secondary voltage is referred to in the electric power metering industry as "burden." The CT secondary current is then inferred from the secondary voltage by the relationship of the CT secondary current being equal to the secondary voltage divided by the connected resistance.

Unfortunately, the accuracy of the CT secondary to primary current conversion is reduced in conventional measurement devices as the voltage or burden applied to the secondary increases. Using a current-to-voltage converting resistor, as the CT secondary current increases, the secondary burden voltage also increases resulting in larger errors in the CT current attenuation. This introduces a non-linearity in current measurements made with CT devices using this technique.

Figure 6:
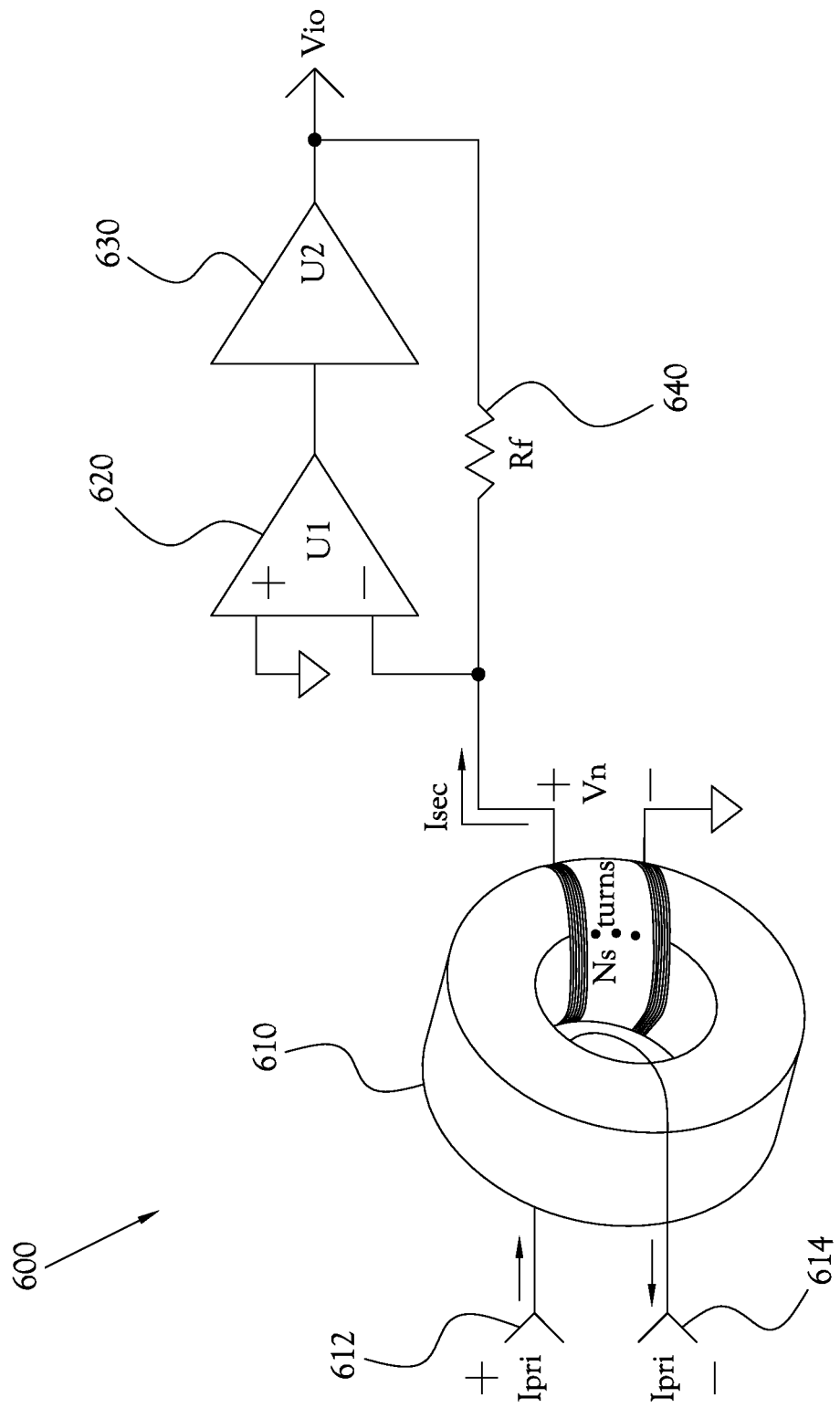
FIG. 6 illustrates a transresistance amplifier that reads a current transformer with substantially zero burden for precision current measurement in the electric power standard according to an embodiment of the present general inventive concept.

FIG. 6 illustrates a transresistance amplifier that reads a current transformer with substantially zero burden for precision current measurement in the electric power standard according to an embodiment of the present general inventive concept. The configuration of the example embodiment illustrated in FIG. 6 is well suited for measuring large currents from high-power distribution systems, and such a circuit may be used in several example embodiments such as a dedicated current measuring device, within the waveform analyzer of FIG. 1 to measure large currents from high-power distribution systems, and so on. In the circuit 600 of the example embodiment illustrated in FIG. 6, a current Ipri is converted to a smaller, more manageable voltage Vio that is easier for modern low-power, low-voltage electronic circuits to digitize with precision. It is noted that the number of turns Ns of the secondary winding is large, and as such the secondary current Isec will be smaller than the input current Ipri. The circuit 600 of this example embodiment is a novel means for precise current waveform attenuation for measurement of large currents, in particular currents from electric power systems. However, it is noted that the example embodiment illustrated in FIG. 6 is not restricted to large current applications, and may be used for a large range of currents as desired by the user.

The example embodiment circuit 600 illustrated in FIG. 6 measures the secondary current Isec from a CT 610, which may be an engineered magnetic core, without generating a significant burden voltage on the CT 610 secondary. Similar to the active inverting precision attenuator illustrated in FIG. 2, the high gain of cascaded amplifiers U1 620 and U2 630, in conjunction with negative feedback, will force all the CT secondary current Isec to flow through a feedback resistor Rf 640 when configured as in the example embodiment illustrated in FIG. 6. The cascaded configuration of the embodiment illustrated in FIG. 6 causes the gains of amplifiers U1 620 and U2 630 multiplies the gains of those amplifiers, and negative feedback forces all of the secondary current in the CT 610 to go to resistor Rf 640 because the high gain keeps the voltage on the negative (−) terminal of amplifier U1 620 very small. Consequently, the current Isec produces an output voltage Vio with a magnitude equal to the product of the resistance of Rf 640 and the current Isec. An inverting phase shift occurs due to the output voltage Vio swinging negative in order for Isec to flow through Rf 640 while keeping the negative input terminal of amplifier U1 620 very near zero volts, or ground, or another reference potential according to various example embodiments of the present general inventive concept. In normal conditions, there is a negligible phase shift through the CT 610, so the phase of Vio is also 180° relative to the circuit input current Ipri, which is the CT 610 primary current. In the example embodiment illustrated in FIG. 6, the positive current input 612 is shown with a positive sign, and the negative current input 614 is shown with a negative sign.

A key characteristic important to the operation of voltage-feedback amplifiers (VFAs) is a very high resistance looking into either the (−) or (+) input terminals. To a first order, only dc current flows in or out of the inputs, and that current can be as low as a few picoamps. At much higher frequencies the situation changes due to the small capacitance on the VFA inputs. Within the application of the embodiments of the present general inventive concept described herein, very high frequency operation is not relevant. The configuration of the example embodiment of FIG. 6 is a trans-resistance amplifier configuration, which indicates that the input is current and the output is voltage. Trans-resistance means volts over current, which is ohms. With such a configuration, while an actual resistance may be large, the effective resistance can be much smaller. This configuration allows a large primary current to be stepped down to a relatively small secondary current, and then back up to a desired level of voltage to be used by the processing circuitry of a handheld device provided with the described circuitry.

The effective voltage Vn applied to the CT 610 secondary by the circuit 600 illustrated in FIG. 6 is discussed herein. The VFA U1 620 inverting (−) input resistance previously discussed, which appears in parallel with Rf 640, is not taken into account because it is a resistance value many orders of magnitude larger than Rf 640. According to various example embodiments of the present general inventive concept, the value of resistor Rf 640 may range from a few hundred to several thousand ohms depending upon the expected range in magnitude of the current to be measured, Ipri, and the magnitude of voltage Vio needed for optimum digitization and/or other means of measurement, processing, etc. Negative feedback, in conjunction with the very high voltage gain of the cascaded amplifiers U1 620 and U2 630, effectively reduce the resistance of Rf 640 as seen looking into the amplifier closed-loop by a factor of up to 140 dB volts (7 orders of magnitude) or more. Consequently, the CT 610 secondary voltage, which is the same as U1 620 amplifier inverting (−) terminal input voltage, Vn, is a factor of five to seven orders of magnitude smaller than Vio at dc (or f equal to zero Hz). Hence, the inverting (−) input of an inverting amplifier is often referred to as a virtual ground.

The magnitude of voltage Vn as a function of signal frequency f can be defined by the zero (numerator polynomial roots) and pole (denominator polynomial roots) frequencies. These characteristic frequencies correspond to points in frequency where the magnitude of a function begins to rise or fall due to its zeros or poles, respectively. The voltage Vn zero characteristic frequency, fol, is the same as the open-loop dominant pole frequency of amplifier U1 620. When the frequency f is greater than fol, the magnitude of Vn rises proportionately with the frequency. An amplifier such as U1 620 will often exhibit an open-loop dominant pole frequency around 1 Hz. At a frequency of 60 Hz, a very common electrical power distribution frequency, Vn will be a factor of four to six orders of magnitude smaller than the Vio output voltage. Essentially, the burden across the CT 610 secondary will be several orders of magnitude less with the example embodiment circuit illustrated in FIG. 6 than the CT burden created by the more common practice of measuring CT current using a resistor, such as in a conventional device.

As with the previously discussed voltage measurement correction circuit, the CT current measurement circuit 600 also utilizes negative feedback. Performance of various example embodiments of the CT current measurement circuit of the present general inventive concept may be optimized in cases in which the feedback loop is engineered for optimum speed and stability for proper function and minimum noise superposition onto the output to be digitized downstream. Such engineering is non-trivial as it comprises a strategic combination of experiment and theoretical analysis. That work is beyond the scope of this disclosure and, again, is not described here.

Instantaneous power metering applications typically require uninterrupted measurement of current and voltage. Voltages associated with typical power measurements generally do not change greatly during a data acquisition cycle. The same is generally not true of currents associated with power measurements because they can change greatly during the acquisition. Consequently, four orders of magnitude dynamic range are beneficial for power standard current measurements.

Figure 7:
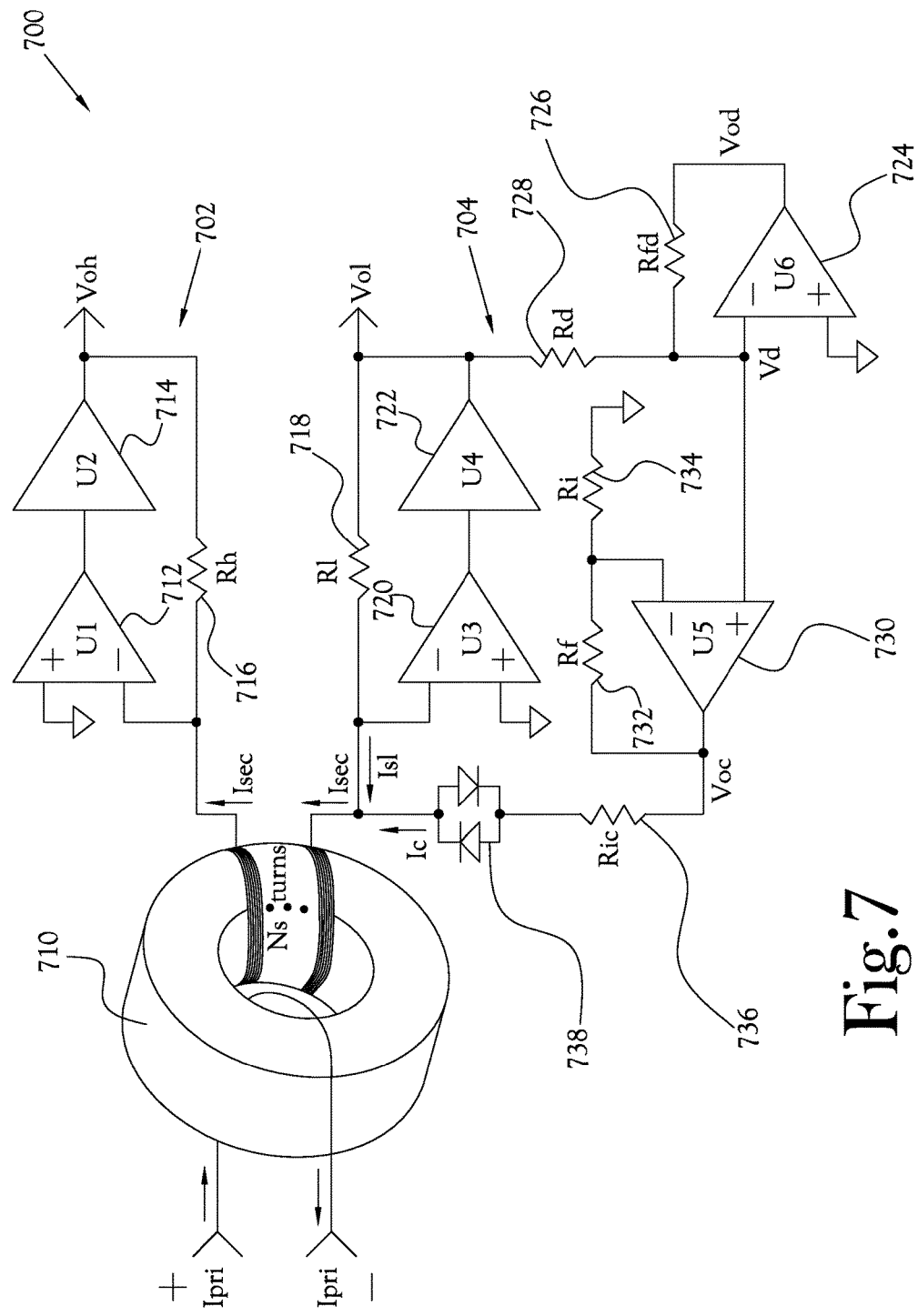
FIG. 7 illustrates a circuit used for continuous dual range current measurement with linear overload according to an example embodiment of the present general inventive concept.

The equivalent circuit 700 illustrated in FIG. 7 shows an example embodiment that addresses this desired dynamic range with a novel electronic design concept. FIG. 7 illustrates a circuit used for continuous dual range current measurement with linear overload according to an example embodiment of the present general inventive concept. The secondary current from a single CT 710 is continuously measured by two cascaded amplifier circuits 702,704 similar to the transresistance amplifier 600 illustrated in FIG. 6, each connected to one side of the CT 710 secondary. The cascaded amplifier circuits 702,704 may be referred to simply as amplifiers 702,704 at points in the descriptions of various example embodiments herein. The feedback resistors, Rh 716 (wherein the "h" indicates the high range output feedback resistor) and Rl 718 (wherein the "l" indicates the low range output feedback resistor), of the two respective transresistance cascaded amplifier circuits 702,704 function in a substantially similar fashion to that of resistor Rf 640 of the circuit 600 illustrated in FIG. 6. By having high range output and low range output circuitry that may operate at the same time, a user is able to switch between high and low output modes without any data loss that is incurred during the toggling between modes of a conventional device. The feedback resistor of the low range output circuitry will be higher than the feedback resistor of the high range output circuitry in various embodiments of the general inventive concept. Adding a large resistance across a CT secondary can add an undesired burden, even with a relatively small current, as the voltage will still be significant. But by using a much larger gain setting resistance in the low range output circuitry, since the current is much smaller than that measured by the high range output circuitry, a small burden may still be maintained on the secondary, and therefore accuracy may be maintained. In the example embodiment illustrated in FIG. 7, the value of Rh 716 is two orders of magnitude smaller than that of Rl 718, and each of the two transresistance cascaded amplifier circuits 702,704 provides a little over two orders of magnitude measurement range. However, it is understood that various example embodiments of the present general inventive concept may provide different values of impedance and/or magnitudes of measurement range. Both transresistance amplifier circuits 702,704 process the same CT secondary current Isec to produce a contiguous measurement range of more than four orders of magnitude for Isec. Thus, no matter the value of the input Ipri, be it high or low, the outputs can be digitized continuously by processing circuitry included in a handheld unit provided with the current measurement circuitry illustrated in FIG. 7. Generally, the high range output Voh will closely approximate (Isec)(−Rh), or (Ipri/Nx)(−Rh), and the low range output will closely approximate (Isec)(Rl), or (Ipri/Ns)(Rl).

In the example embodiment of the present general inventive concept illustrated in FIG. 7, the transresistance amplifier circuit 702 is configured as a high-range amplifier, and the transresistance amplifier circuit 704 is configured as a low-range amplifier. Accordingly, the output voltage signal for the respective transresistance amplifier circuits 702,704 is indicated as Voh and Vol. In order to provide the virtual grounding of both sides of the CT 710 secondary for maximum CT accuracy, both connected transresistance amplifier circuits 702,704 are configured to maintain linear, unsaturated operation. The high-range amplifier 702 will never saturate, because in normal operation it will never receive an input large enough to drive its output to the power supply rail (not shown), which would result in saturation. When saturated, an amplifier's effective gain drops to zero, so the voltage Vn of the circuit 600 illustrated in FIG. 6 will rise from near zero to a level comparable to the Vio output voltage.

Steps are taken to prevent saturation of the lower transresistance amplifier 704 of the circuit 700 illustrated in FIG. 7 when the magnitude of the input signal, Isec, is in the upper two decades of the total measurement range. A CT secondary current that large would otherwise drive the lower transresistance amplifier 704 output Vol to its power supply rail. Consequently, the voltage on the inverting (−) terminal of amplifier U3 720 will be very large, placing a large burden on the CT 710. It is noted that these described ranges and thresholds may vary according to different example embodiments of the present general inventive concept.

The low-range transresistance amplifier 704 is maintained in linear operation throughout the four orders of magnitude Isec measurement range by a linear overload negative feedback circuit, as illustrated in FIG. 7 and described herein. The linear overload negative feedback circuitry includes additional amplifier circuitry including amplifier U6 724, resistor Rfd 726, and resistor Rd 728, and slightly amplifies the magnitude of the low-range amplifier output Vol such that the U6 724 amplifier output Vod will reach its supply voltage rail as the low-range output Vol exceeds its maximum Isec measurement range magnitude. When Isec increases further, the U6 amplifier 724 Vod saturates and its inverting (−) terminal input voltage Vd then rises or falls depending upon whether the low-range output Vol is at the bottom or top of its swing, respectively (since amplifier U6 724 inverts the input Vol in the production of its output Vod). Consequently, the amplifier U6 724 inverting (−) terminal voltage Vd becomes positive and negative pulses that are essentially the attenuated tops and bottoms, respectively, of the low-range Vol voltage output. The signal Vd is amplified by non-inverting amplifier circuitry including amplifier U5 730, resistor Rf 732, and resistor Ri 734 to produce output voltage Voc. Voltage Voc is dropped across the series combination of resistor Ric 736 and a bi-directional diode pair 738 to create a current Ic which is output from the bi-directional diode pair 738.

Figure 8C:
FIGS. 8A-8F illustrate portions of waveforms corresponding to various signals encountered in the example embodiment of the continuous dual range current measurement circuit illustrated in FIG. 7.
Figure 8B:
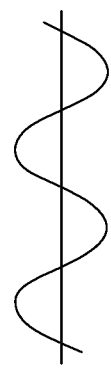
Figure 8A:
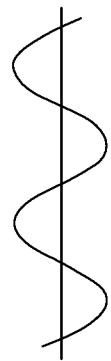
Figure 8F:
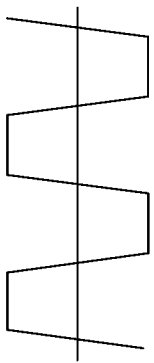
Figure 8E:
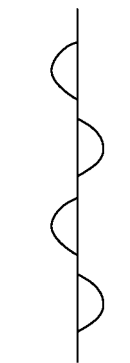
Figure 8D:
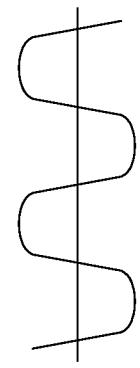

FIGS. 8A-8F illustrate portions of waveforms corresponding to various signals encountered in the example embodiment of the continuous dual range current measurement circuit illustrated in FIG. 7. As previously discussed, Voh/Ipri, in volts per amp, will be of a smaller value than Vol/Ipri, in volts per amp, because the resistance of Rh 716 is smaller than the resistance of Rl 718. Throughout the high range of Voh, |Vol| is held at approximately |Volmax|=|Vodmax|*Rd/Rfd. In these expressions, |Vodmax| is equal to the supply voltage of U3 720. The resistance of Rd 728 is smaller than that of Rfd 726, so that |Volmax|<|Vodmax|. Thus, the U4 722 output, Vol, cannot saturate. In other words, due to this "clamping" circuitry, U4 722 always operates in a linear mode. The linear overload circuitry is implemented when the current is large enough to cause the high range output processing of the current signal from the CT 710. In a range of current values from the low range minimum to the low range maximum, Iprilomin<Ipri<Iprilomax, Vol will closely approximate (Ipri/Ns)(Rl), and Ic and Vd will have a value of zero. In a range of current values from the high range minimum to the high range maximum, Iprihimin<Ipri<Iprihimax, Voh will closely approximate (Ipri/Ns)(−Rh), and Ic will approximately equal Isec. In these expressions, Iprilomax is approximately equal to Iprihimin. FIG. 8A illustrates an example of the high range output Voh in a high range output mode, and FIG. 8B illustrates an example of the low range output Vol in a low range output mode, when |Ipri|<|Iprilomax|. FIG. 8C illustrates Vd in the low range output mode, in which Ic and Vd are approximately 0. However, FIGS. 8D-8F illustrate the operation of the linear overload circuitry when Ipri is so high as to move the low range amplifier 704 to linear overload, when |Ipri|>|Iprilomax|. FIG. 8D illustrates Vol in linear overload, as U4 722 is prevented from saturating by the linear overload circuitry. FIG. 8E illustrates Vd in linear overload, which are the previously described positive and negative pulses that are essentially the attenuated tops and bottoms, respectively, of the low-range Vol voltage output, and FIG. 8F illustrates Vod in linear overload.

As illustrated in FIG. 7, the current Ic, in turn, takes Isec current from the low-range transresistance amplifier 704 input current Isl. Negative feedback and the high transconductance, Ic/Vol, of the U5 730 and U6 724 feedback circuitry generate the current Ic as required to prevent the low-range output Vol from reaching its power supply rail and saturating. Since the low-range transresistance output Vol never saturates, a virtually zero burden is continuously maintained on the CT secondary.

The bi-directional diode pair 738 of the example embodiment circuit 700 illustrated in FIG. 7 effectively produces a dead-band in the linear overload feedback loop. This prevents the linear overload feedback from interfering with low-range operation in the lower two decades of measurement range from possible dc offset voltages produced by the amplifiers in the feedback path. Typically, no linear overload feedback is needed until the low-range output is above its maximum. When Vol is in the linear range, Vod is essentially a sine wave. When linear overload is achieved, because Rfd 726 is larger than Rd 728, Vod is going to be larger than Vol, so that U6 724 saturates before U4 722 will. But before the saturation of U6 724 Vd is just another virtual ground, so essentially the only voltage in Voc is due to the DC offset. In such a situation, the diode pair 738 provide a dead band such that there is no robbing of Isec. Thus, in the normal operation of the low range output mode, the linear overload circuit is basically not engaged.

According to various example embodiments of the present general inventive concept, regardless of the speed and magnitude of transients in Isec, both current measurement outputs, Vol and Voh, can be simultaneously digitized downstream within the anti-aliasing measurement bandwidth and the four decade dynamic range. This allows the precise magnitude of Isec to be known at all times.

As with the previously described single channel CT current measurement circuit, the dual range CT current measurement circuit 700 illustrated in FIG. 7 utilizes multiple negative feedback loops. In particular the linear overload feedback circuit is complex to analyze and optimize. As always in negative feedback circuit design, the performance of various example embodiments of the present general inventive concept may be optimized in cases in which the feedback loop is engineered for optimum speed and stability for proper function and minimum noise superposition onto the output to be digitized downstream. Such engineering is non-trivial as it comprises a strategic combination of experiment and theoretical analysis. That work is beyond the scope of this disclosure and, again, is not described here.

Figure 9A:
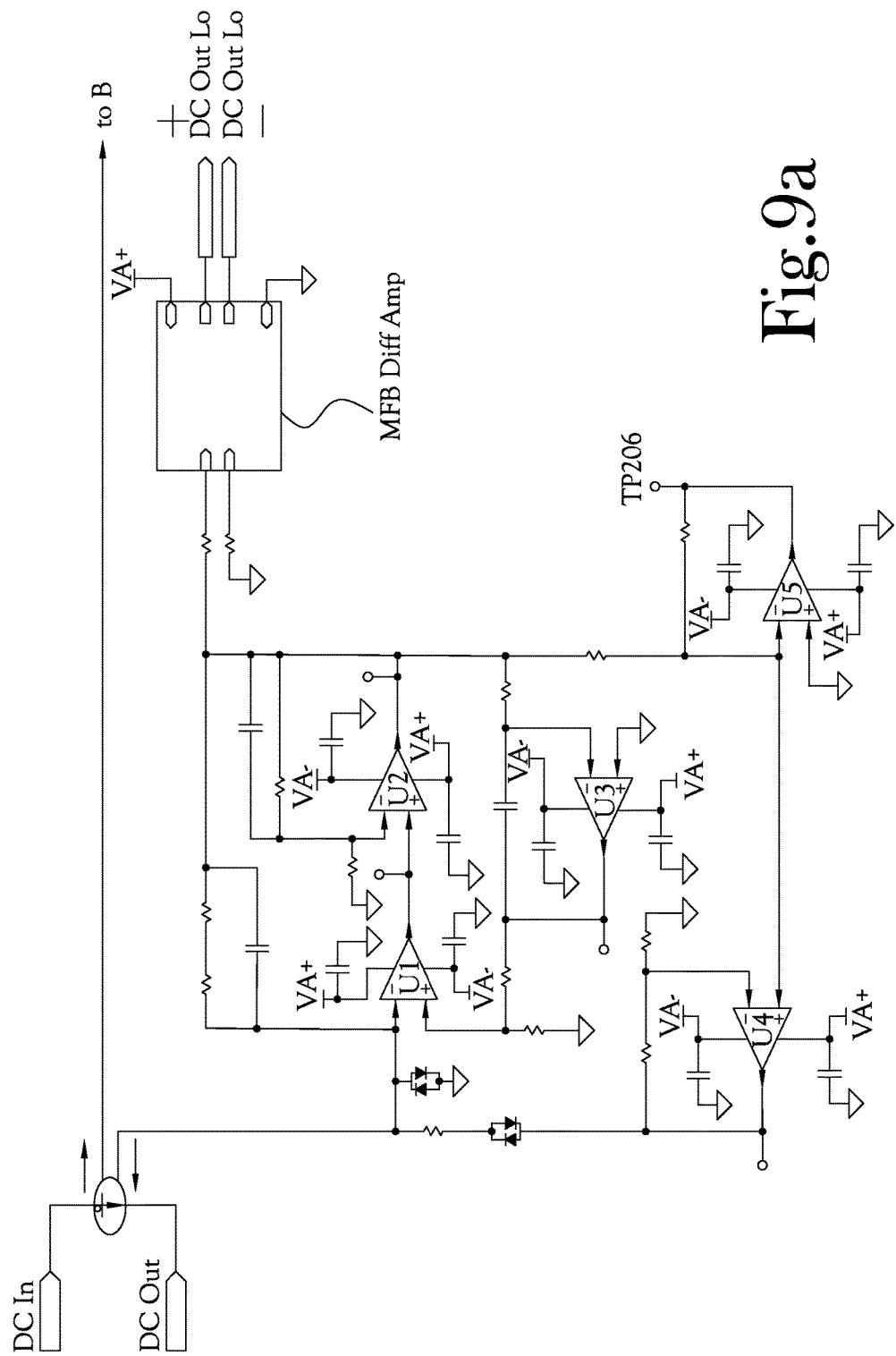
FIGS. 9A-9B illustrate, respectively, low and high range circuit portions of a continuous dual range current measurement circuit according to another example embodiment of the present general inventive concept.
Figure 9B:
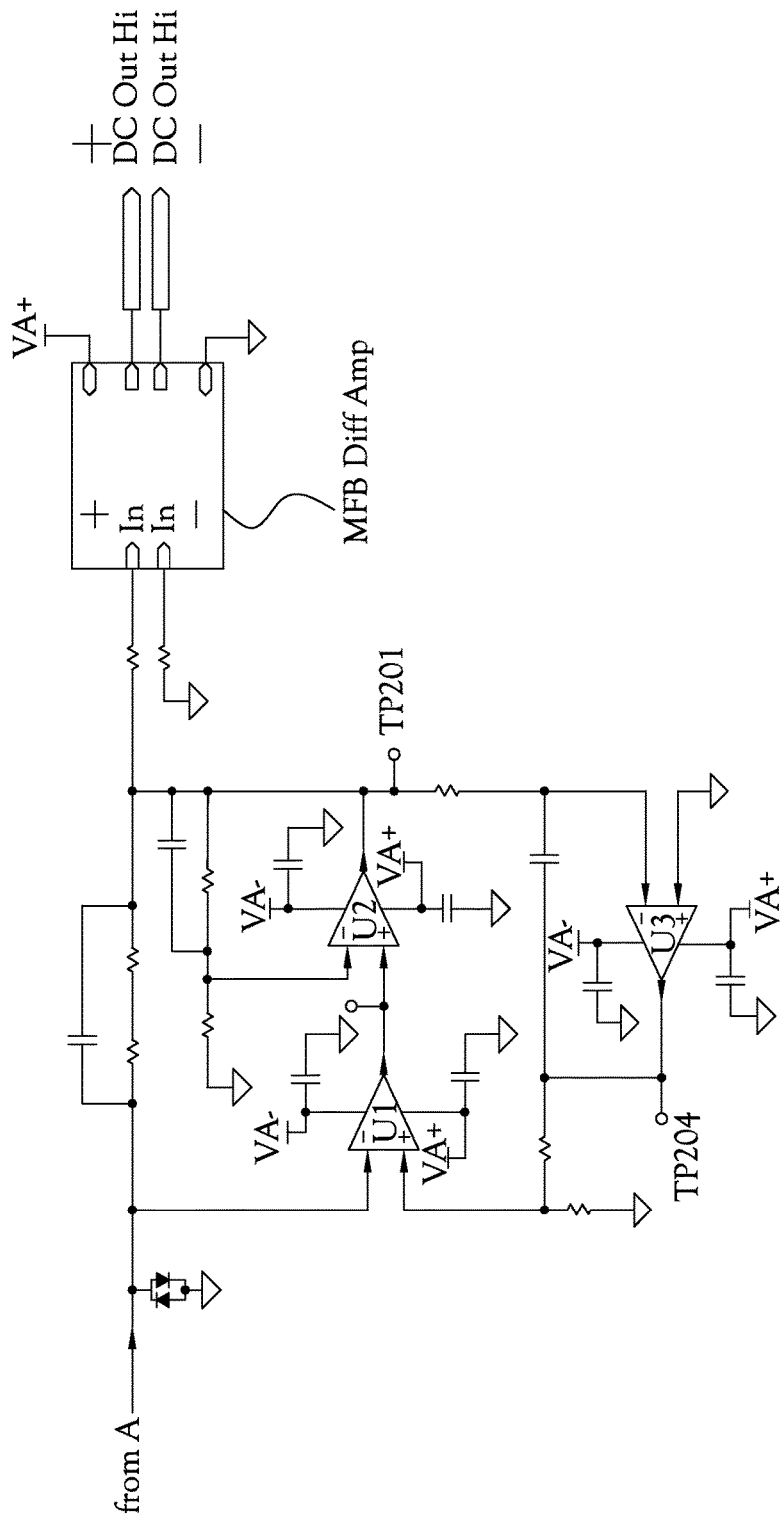

FIGS. 9A-9B illustrate, respectively, low and high range circuit portions of a continuous dual range current measurement circuit according to another example embodiment of the present general inventive concept.

Regarding the outputs of each measurement channel in the various example embodiments described above, it may be desirable for the circuitry of a device to be capable of high-resolution digitization for analytical post processing of the signals that may be important to the accuracy of a power standard or other instrumentation where maximum accuracy is desired. The precision of analog signal conversion may be maximized by the use of analog-to-digital converter (ADC) devices that have fully differential rather than single-ended inputs. Single supply ADC operation, typically a voltage that is referenced to a local ground, minimizes power requirements important to maximize the runtime of battery powered instruments. However, there are problems with such a configuration, such as requiring a positive and a negative DC voltage to supply the needed dynamic range above and below ground. One inherent problem with such a topology is the errors associated with the local ground relative to wherever the ground is of the measured signal, however far away that it is not practical or possible to measure with the ADC against that relative ground. In other words, the local ground will not replicate the far away ground. Use of differential inputs is consistent with single-supply ADC operation since differential signals have double the dynamic range of single-ended signals per volt of dc power supply. In other words, with differential signaling, the dynamic range of the device is effectively doubled. A differential amplifier such as described herein has inherent accuracy benefits, including a more accurate input topology to the ADC, saving power, and removing the local ground problems described above. Such a configuration allows the ADC to digitize differentially, and determine a digital conversion code based on the difference between the positive terminal and the negative terminal, rather than relative to a local ground. In other words, the output of an example embodiment differential amplifier according to the present general inventive concept is a function of the positive input voltage and the negative input voltage. In such a configuration, one of the inputs can be in electrical communication with the local ground of the measuring circuit that is generating the input signal, and the other input can be in electrical communication with the actual output signal of that measuring circuit, such that the previously described problem caused by the ground local to the differential amplifier being removed from a ground local to the measuring circuit is avoided. The present general inventive concept allows a single-ended output signal to be converted to a differential signal, to be supplied to the ADC, in a very precise manner.

Satisfying Harry Nyquist's sampling criteria, known to those skilled in the art, may provide the best ADC accuracy. Thus, the sampling rate (samples per second) of an ADC system may be at least twice the highest frequency in the bandwidth of the signal to be sampled or digitized to avoid injecting aliasing distortion into the digitized signal. Therefore, the bandwidth of the signal to be submitted to the ADC may be limited by passing the signal through a low-pass analog filter, commonly referred to as an anti-aliasing filter.

Therefore, according to various example embodiments of the present general inventive concept, an all positive, differential, anti-aliased signal riding on a dc reference voltage at the middle of the ADC power supply voltage may be submitted to an ADC for maximum accuracy and minimum power consumption. In order to meet these criteria, a solution that can provide fully differential operation as well as single-ended to differential conversion is provided. Level shifting to the mid-supply voltage may be desired so that the full input dynamic range of the ADC can be utilized. Low-pass filtering that limits the bandwidth of the signal may also be provided to mitigate distortion and noise.

Figure 10:
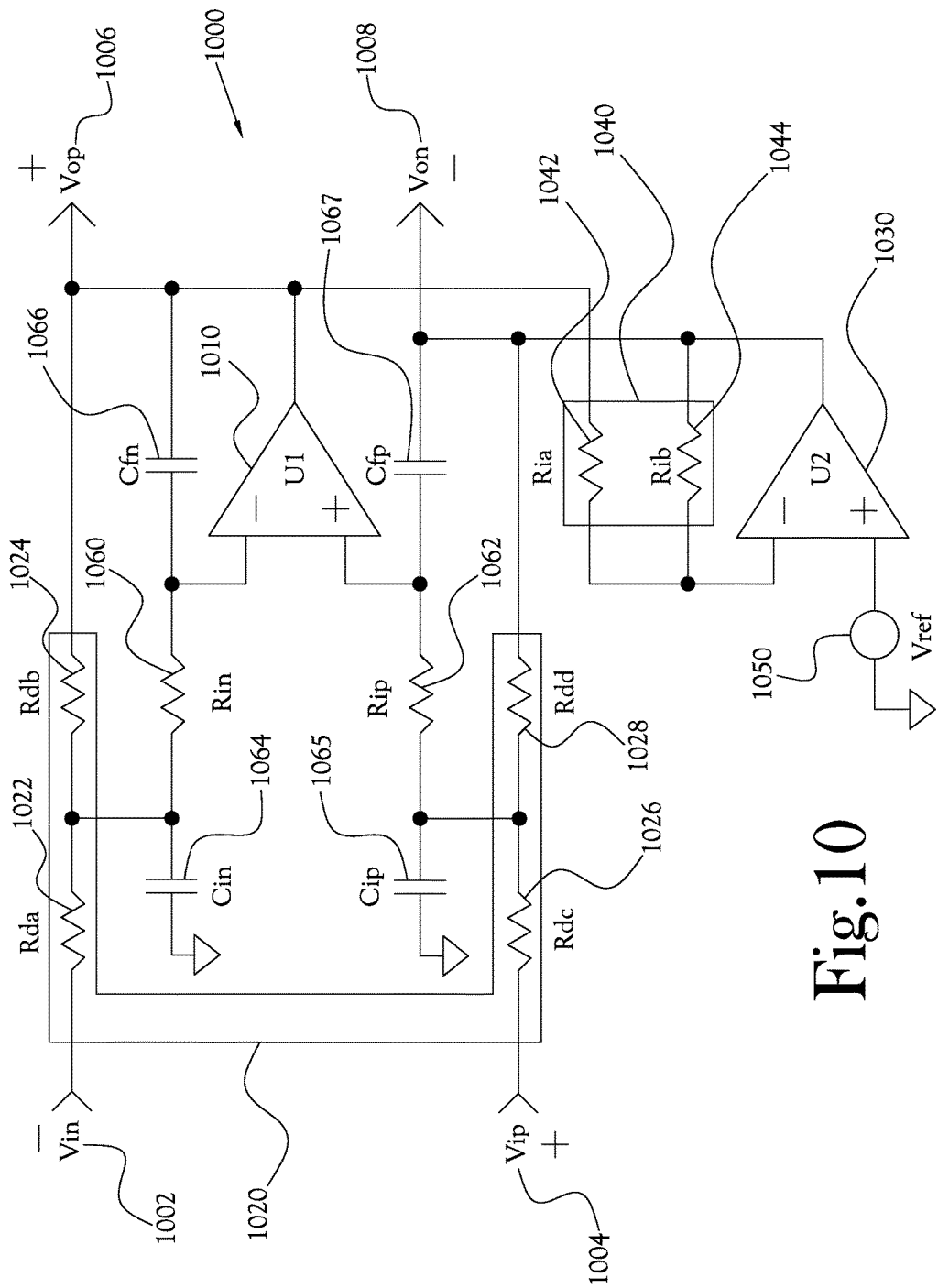
FIG. 10 illustrates a combination fully differential amplifier and anti-aliasing filter circuit according to an example embodiment of the present general inventive concept.

FIG. 10 illustrates a combination fully differential amplifier and anti-aliasing filter circuit according to an example embodiment of the present general inventive concept. The example embodiment of the combination fully differential amplifier and anti-aliasing filter of the circuit 1000 illustrated in FIG. 10 optimally converts output signals of the aforementioned example embodiment measurement circuits into signals that fulfill the desired characteristics described above. Conventional power standard instruments do not include such an amplifier as that illustrated in FIG. 10.

The illustration in FIG. 10 illustrates a differential in/out amplifier with thermally stabilized gain and integral anti-alias multiple feedback filter according to an example embodiment of the present general inventive concept. As illustrated in FIG. 10, the multiple purpose amplifier 1000 is provided with a negative voltage input 1002, a positive voltage input 1004, a positive voltage output 1006, and a negative voltage output 1008. According to various example embodiments, a classic 4-resistor differential input amplifier may be provided as the basic building block of the multiple purpose amplifier 1000 illustrated in FIG. 10. This topology uses a VFA U1 1010, and four resistors, Rda 1022, Rdb 1024, Rdc 1026, and Rdd 1028, in a single precision array 1020 to set the gain and produce a differential input operation. As in the previously described voltage measuring circuits, the thermally connected array 1020 of resisters offer improved tracking over vastly different temperatures. In various example embodiments of the present general inventive concept, matching of the four resistors 1022, 1024, 1026, 1028 afforded by the array 1020 implementation may be optimal to produce minimum initial and drift gain errors. Close matching of the ratios Rdd/Rdc and Rdb/Rda maximizes the common-mode-rejection-ratio (CMRR), which minimizes errors due to common-mode noise. The same resistor ratios also set the differential gain of the amplifier which can consequently be set above or below unity. In the example embodiment illustrated in FIG. 10, an amplifier U2 1030 and a resistor array 1040 containing Ria 1042 and Rib 1044 are added to provide fully differential output operation. The inverting U2 1030 unity gain set by the ratio of resistors Ria 1042 and Rib 1044 in the array 1040 also minimizes initial and drift gain errors.

A third voltage input Vref 1050, which may be referred to as a baseline voltage input, precisely projects unchanged onto both the positive and negative outputs regardless of differential gain due to the U2 1030 amplifier and a property of the 4-resistor array 1020 topology. As shown in the example embodiment of the present general inventive concept illustrated in FIG. 10, the baseline voltage input can be driven by the precision voltage reference Vref 1050 at the power supply mid-voltage. The amplifier 1000 positive and negative outputs' zero signal voltage is thus biased in the middle of the dynamic range set by a single dc power supply voltage. This allows both the amplifier 1000 and, as previously mentioned, the ADC to operate with a single dc power supply.

Another useful property of the differential amplifier topology of this example embodiment is that the dynamic voltage range of each input 1002, 1004 is twice that of the outputs 1006, 1008. The input voltages 1002, 1004 can swing as far above and below power ground as the voltage of the single dc power supply. This allows the amplifier 1000 to accept bipolar signals referenced to ground from dual supply circuits like the outputs of the aforementioned voltage and current measurement circuits 300, 700. Consequently, single or dual supply operational amplifier buffers (not shown) can be used to drive the positive and negative inputs 1002, 1004 to increase the input impedances seen by upstream signal sources.

The composite differential amplifier 1000 of this example embodiment of the present general inventive concept includes a fully differential low-pass signal filter to minimize anti-aliasing distortion in downstream ADC operation. A well known MFB low-pass topology may be added in a completely symmetrical fashion consistent with the symmetry of the gain-setting components discussed above. Use of matched discrete resistors with approximately 1% tolerance, Rin 1060 and Rip 1062, and NPO ceramic capacitors, Cin 1064, Cip 1065, Cfn 1066, and Cfp 1067, provide adequate conformance to the theoretical filter differential response.

This symmetry produces a fully differential operation that can be expressed in a differential output versus input relationship.

The difference in the positive and negative output voltages 1006,1008 closely equal the difference in the positive and negative input voltages 1002,1004. The input resistance Rdi of the input signals can be configured to be equal to the resistance of the resistor Rda 1022, and the resistor Rdc 1026. The feedback resistance Rdf can be configured to be equal to the resistance of the resistor Rdb 1024, and the resistor Rdd 1028. Thus, the array 1020 provides symmetrical values in which the resistors Rda 1022 and Rdc 1026 can have matching values, and the resistors Rdb 1024 and Rdd 1028 can have matching values. Similarly the resistors Ria 1042 and Rib 1044 provided on the array 1040 can have matching values. The value Ri can be configured to be equal to the value of Rin 1060, as well as the value of Rip 1062, and the value Ci can be configured to be equal to the value of Cin 1064, as well as the value of Cip 1065. Thus, similar to other components of the circuit 100, there is symmetry between the resistors Rin 1060 and Rip 1062, as well as between the capacitors Cin 1064 and Cip 1065. Likewise, the value Cf can be configured to be equal to the value of Cfn 1066, as well as the value of Cfp 1067. The change in the resistive characteristics of Rda 1022 over a change in temperature will be approximately equal to the change in Rdc 1026 over the same change in temperature, the change in Rdb 1024 over the same change in temperature, and the change in Rdd 1028 over the same change in temperature. Similarly, the change in the resistive value of Ria 1042 over a change in temperature will be approximately equal to the change in Rib 1044 over the same change in temperature. Thus, the change in ratio of Rdf to Rdi over a change in temperature will be approximately zero, and the change in ratio of Ria 1042 to Rib 1044 over a change in temperature will be approximately zero, because Rda 1022, Rdb 1024, Rdc 1026, and Rdd 1028 are precision resistors fabricated on a same substrate, and Ria 1042 and Rib 1044 are precision resistors fabricated on a same substrate.

Integration of the anti-aliasing filter into the amplifier 1000 eliminates the need for the common practice of adding separate stages of signal conditioning channels for filtering. This minimizes noise, reduces distortion, increases reliability, and reduces power consumption.

Figure 11:
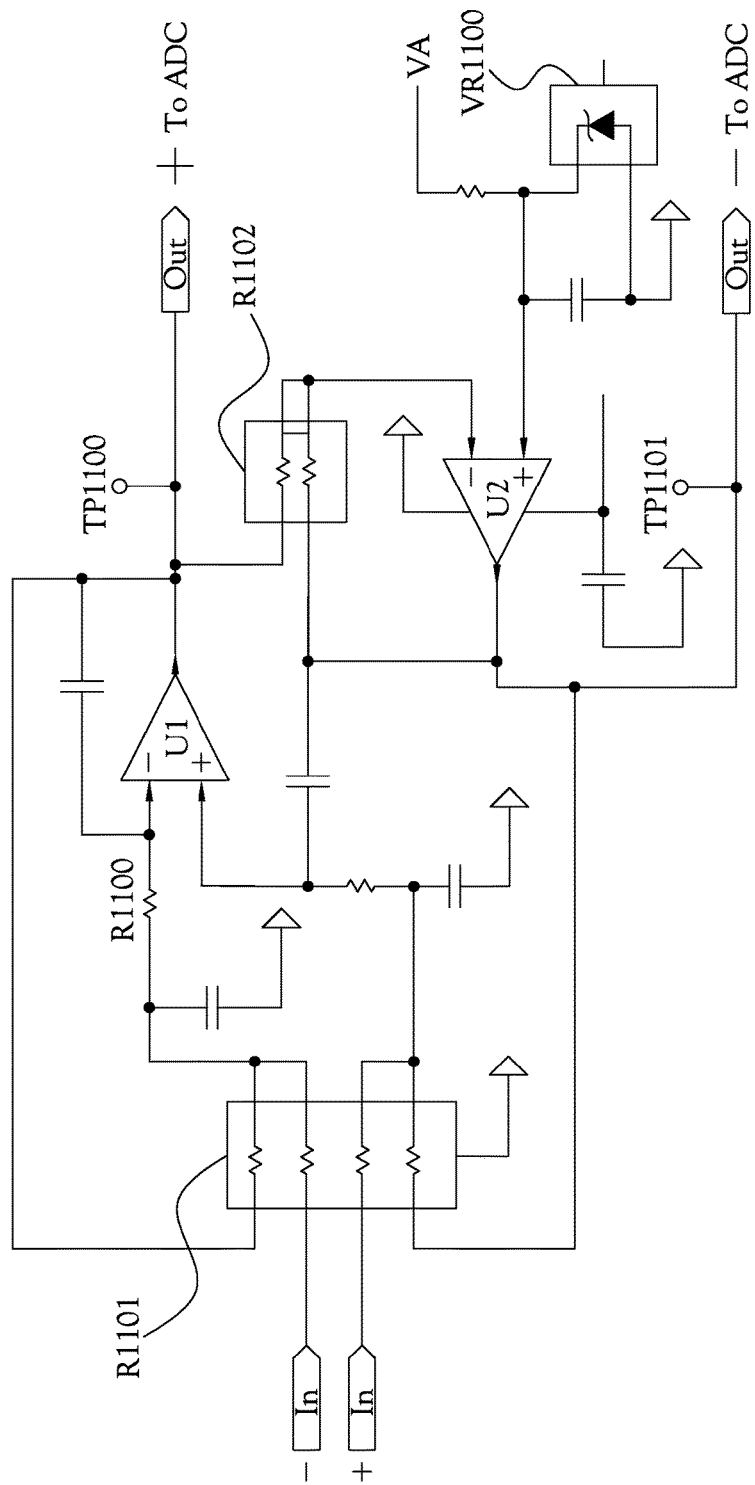
FIGS. 11-12 illustrate, respectively, differential in/out amplifier circuits according to another example embodiment of the present general inventive concept
Figure 12:
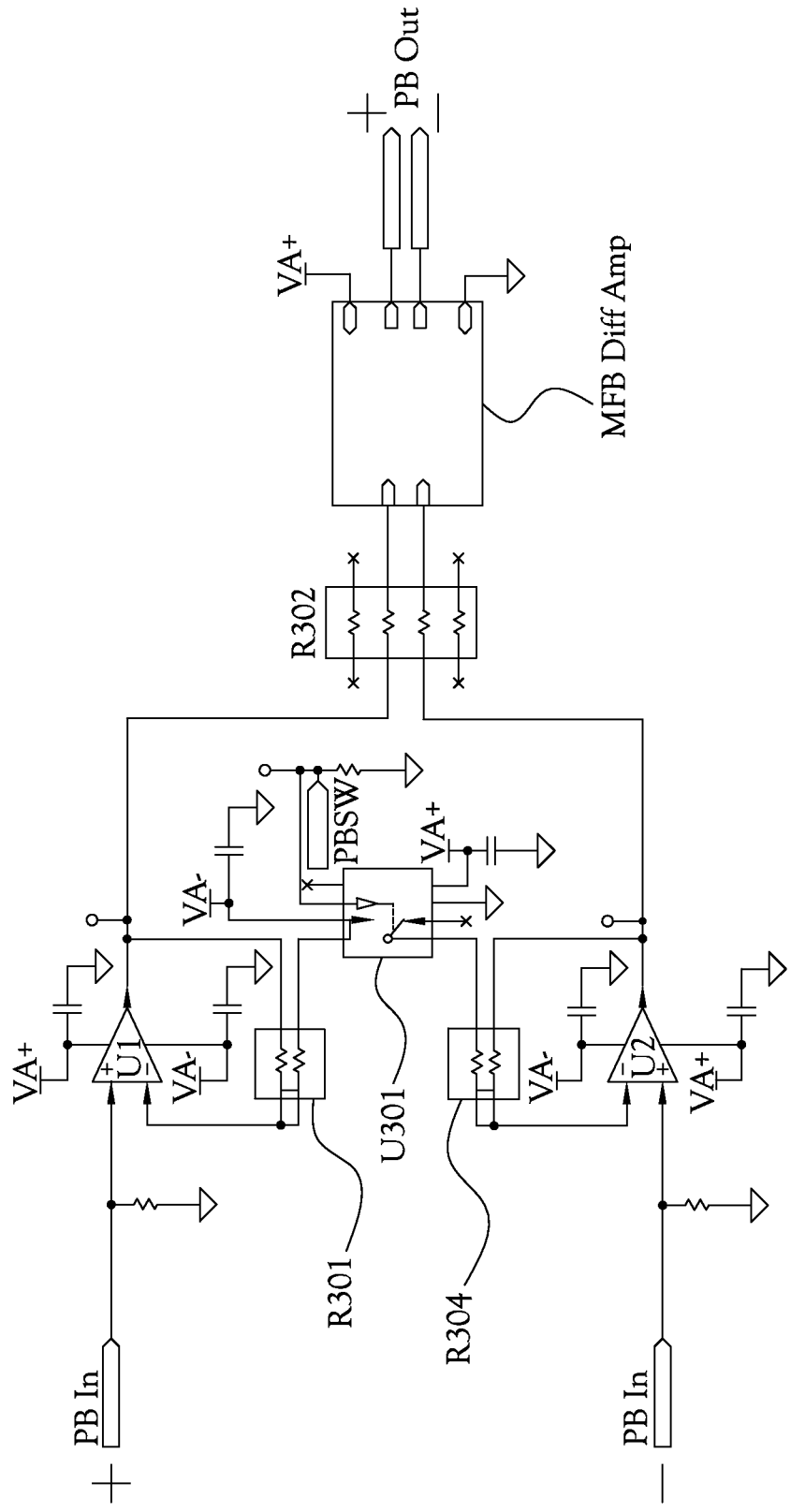

FIGS. 11-12 illustrate, respectively, differential in/out amplifier circuits according to another example embodiment of the present general inventive concept.

Figure 13:
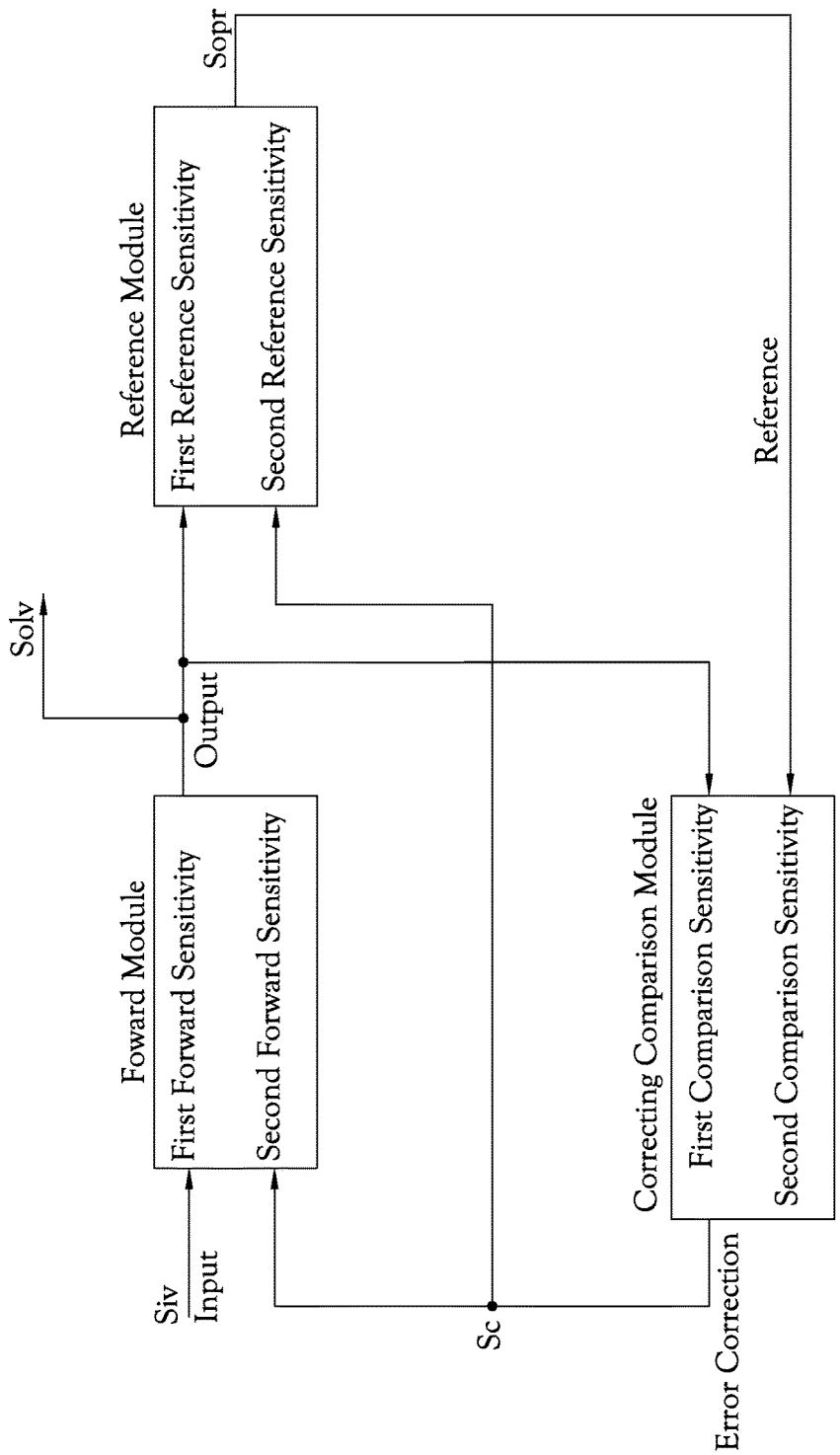
FIG. 13 illustrates a block diagram of various components of a signal conditioning circuit according to an example embodiment of the present general inventive concept.

FIG. 13 illustrates a block diagram of various components of a signal conditioning circuit according to an example embodiment of the present general inventive concept. The block diagram of FIG. 13 illustrates a functional diagram of the example signal conditioning circuit including a forward module, a reference module, and correcting comparison module. These modules include a plurality of sensitivities that condition an input signal Siv through the use of a reference signal Sopr and an error correction signal Sc in such a way that an output signal Solv is corrected for inaccuracies of circuit elements used to set the desired sensitivity of the output signal to the input signal, initially and over temperature.

The forward module of FIG. 13 includes the superposition of a first forward sensitivity to the input signal Siv and a second forward sensitivity to the error correction signal Sc to produce the conditioned output signal Solv. The error correction signal Sc modulates the output signal Solv to correct for inherent inaccuracies initially and over temperature of at least one passive component of the first forward sensitivity.

The reference module of FIG. 13 includes the superposition of a first reference sensitivity to the output signal Solv and a second reference sensitivity to the error correction signal Sc. These sensitivities produce the conditioned reference signal Sopr such that the reference signal Sopr is responsive to the input signal Siv but has substantially zero responsiveness to the error correction signal Sc. The reference signal Sopr sensitivity due to the error correction signal Sc is substantially zero when the cascaded combination of the second forward sensitivity and the first reference sensitivity is equal in magnitude and inverted in sign to the sensitivity through the second reference sensitivity.

The correcting comparison module of FIG. 13 includes an amplified sum of the output signal Solv and the reference signal Sopr with a weighting of the two signals substantially equivalent to the nominal value of the first reference sensitivity. The reference signal Sopr is also conditioned by the first reference sensitivity of the reference module to be inverted in sign relative to the output signal Solv such that the comparison of the correcting comparison module will be an amplified weighted difference of the reference signal Sopr and the output signal Solv to produce the error correction signal Sc.

In the example embodiment of the present general inventive concept illustrated in FIG. 13, the forward module and the reference module each include at least one passive element formed on a same thermally conductive substrate such that the sensitivities above are substantially affected by the matching errors of the passive elements rather than by the absolute error between the passive element values and their specified nominal values, initially and over temperature.

During an ac energy conditioning with a customer load, the current being converted can exhibit large, rapid changes in magnitude. Example embodiments of present general inventive concept enable precise conditioning of current regardless of the order of magnitude of the input or how much the input current changes within the conditioning period. One aspect that compelled various example embodiments of the present general inventive concept is the desire to accurately and continuously condition over greater than four decades of current using a single current transformer. In various example embodiments there may be two bipolar, alternating-current conditioning channels used with one current transformer (CT) to condition a primary-side current. To achieve the amount of required more than four decades of dynamic range, two ranges may be implemented, a high range and a low range. The high range may be used from a maximum allowable input signal to some predefined value, while the low range may be used from a minimum allowable input signal to a different predefined value that is beyond the other predetermined value. This overlap in ranges will ensure accurate operation at all desired inputs. The current flowing in the CT secondary will be substantially identical for both inputs. In addition, both ranges are continuously and simultaneously conditioned, which eliminates the need for the use of switches to bypass a range or change from one range to another. The usage of switches is avoided to achieve the required dynamic range and prevents large switching and loading transients that can cause overall conditioning error when continuously conditioning current across the switchover point from one range to another.

Figure 14:
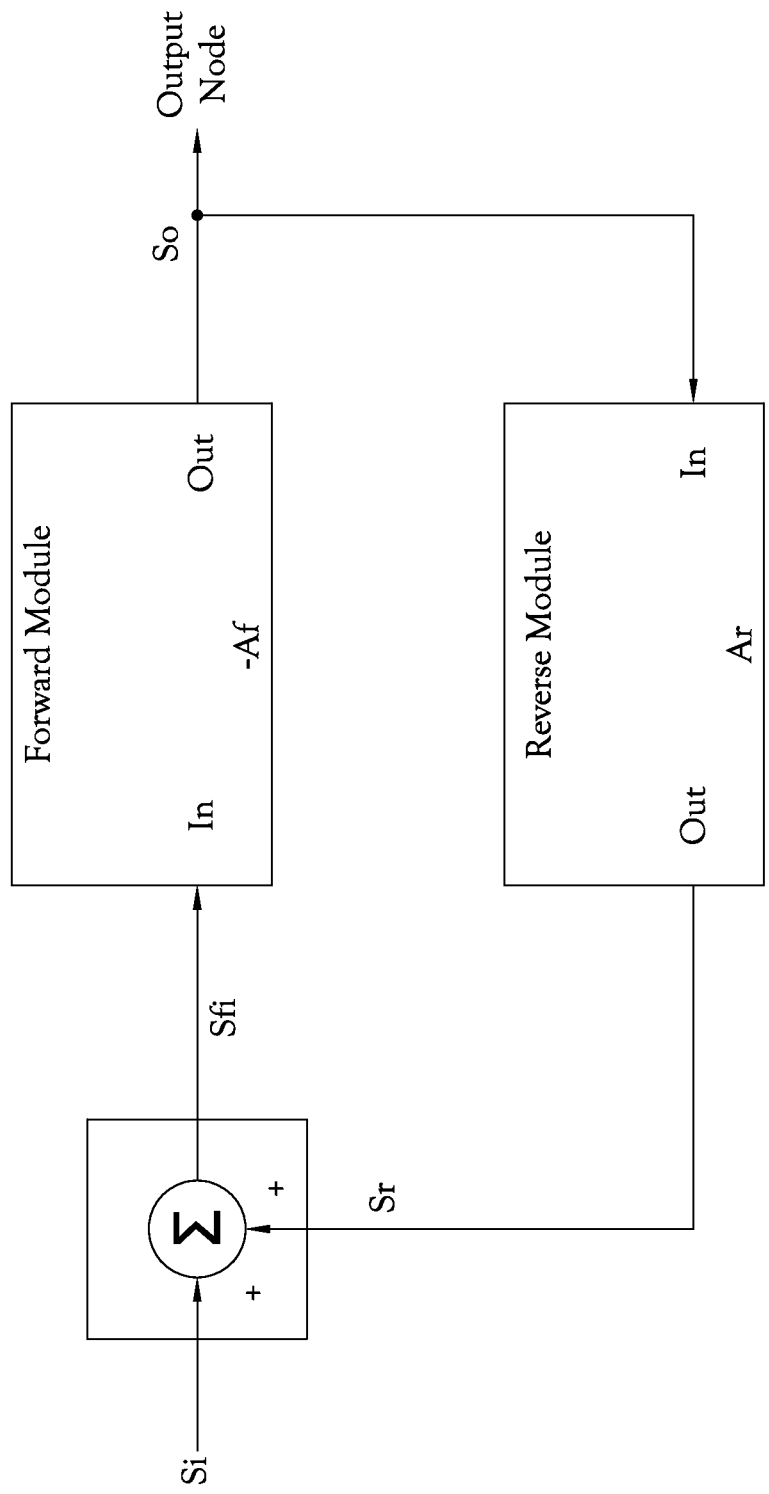
FIG. 14 illustrates a block diagram of various components of a signal conditioning circuit according to an example embodiment of the present general inventive concept.

FIG. 14 illustrates a block diagram of various components of a signal conditioning circuit according to an example embodiment of the present general inventive concept. The block diagram illustrated in FIG. 14 shows various signals that are input/output to/from the illustrated forward module, reverse module, and summing module. All signals associated with the example embodiment of FIG. 14 are electrical signals that can be either voltage or electrical current type signals. An input electrical signal Si from a signal source is an input to be conditioned, and is applied to a first input of a summing module. The summing module has a total sum output which substantially instantaneously produces a forward input signal Sfi that is applied to the input of the forward module. The forward module has an output that substantially instantaneously produces a forward output signal So which is applied to a reverse input of the reverse module which has a reverse output that substantially instantaneously produces a reverse output signal Sr that is applied to a second sum input of the summing module. The forward output signal So has a forward sensitivity −Af to the forward input signal Sfi such that −Af=−(So/Sfi) where Af is negative to represent an inverting sensitivity. The reverse output signal Sr is generated only when the forward output signal So magnitude exceeds a threshold value representing a predetermined percentage of the linear operating range of the forward output of the forward module. The reverse output signal Sr has a reverse sensitivity Ar to a difference signal ΔSo determined by the difference between the forward output signal So and the threshold value such that Ar=Sr/ΔSo where Ar is positive to represent a non-inverting sensitivity. Another example embodiment may have a configuration that produces conditioning where the forward output So is generated in-phase with the input electrical signal Si, and such that Af is positive (non-inverting) and Ar is negative (inverting). Regardless, the reverse output signal Sr will be inverted with respect to the input signal Si and thereby subtract substantially instantaneously from the input signal Si producing the forward input signal Sfi smaller than the input signal Si when Sr is non-zero corresponding to a forward output signal So greater than the threshold value. The net conditioning result is that the output forward output signal So of this example embodiment is determined substantially instantaneously by the input signal Si multiplied by the forward sensitivity Af when the forward output signal So magnitude is less than the threshold value. When the forward output signal is greater than or equal the threshold value, the net conditioning result is that the embodiment output forward output signal So is determined by the input signal Si multiplied by a parallel combination of Af and 1/Ar; i.e., the present example embodiment input-to-output transfer function is equal to 1/(Ar+1/Af) when the forward output So is in the upper region of the linear operating range of the forward output. Careful choice of the reverse sensitivity Ar and the threshold value representing a point in the predetermined percentage of linear operating range can prevent saturation of the forward output that produces the forward output signal So.

Figure 15:
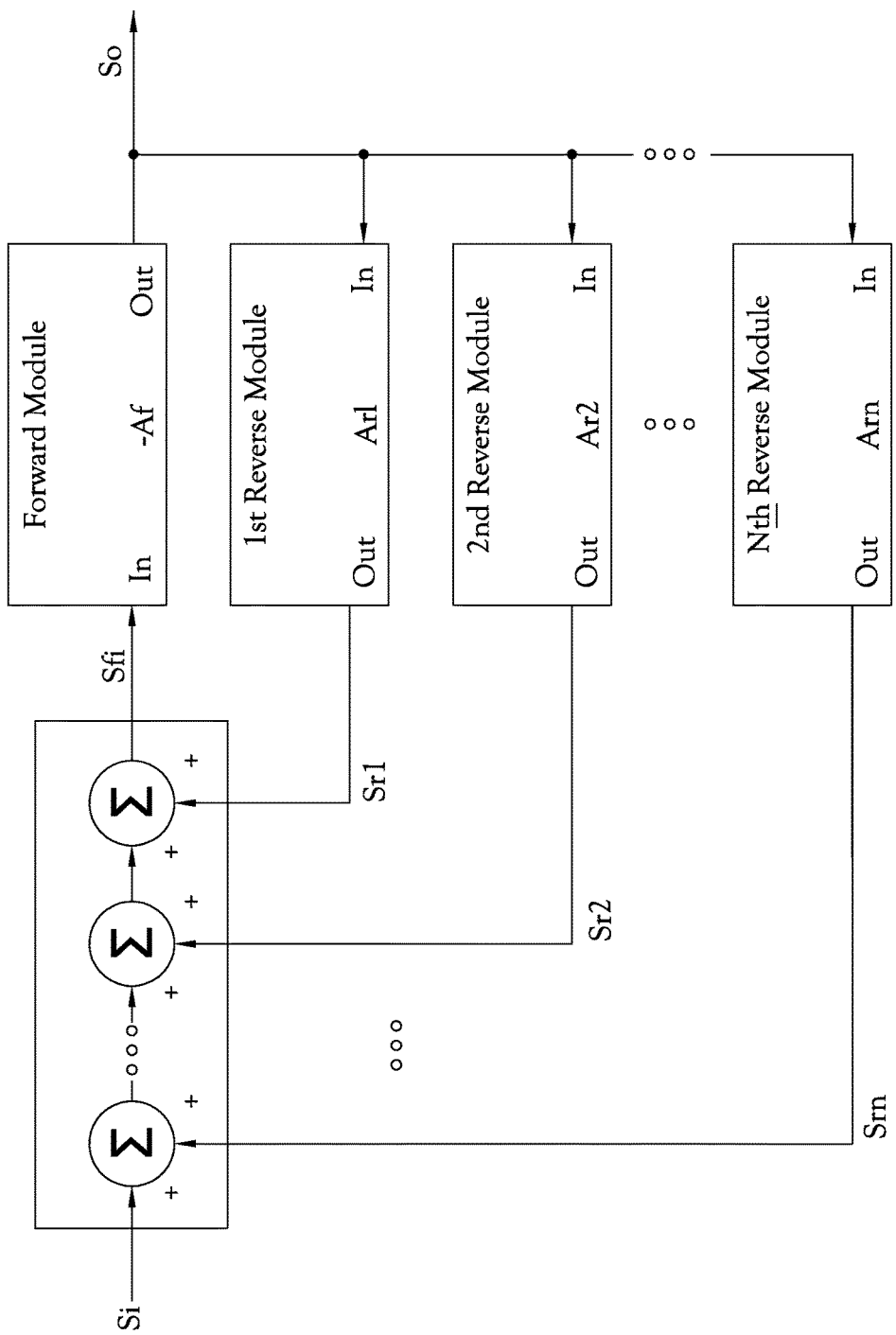
FIG. 15 illustrates a block diagram of various components of a signal conditioning circuit according to another example embodiment of the present general inventive concept.

Other various example embodiments of the present general inventive concept may include a natural expansion of the embodiment illustrated in FIG. 14. For example, FIG. 15 illustrates a block diagram of various components of a signal conditioning circuit according to another example embodiment of the present general inventive concept. The example embodiment illustrated in FIG. 15 produces a similar change to the input-to-output transfer function illustrated in FIG. 14, except for the use of multiple reverse modules. The use of multiple reverse modules produces an equal number of multiple threshold values, each corresponding to an increasing forward output signal So magnitude such that all are predetermined to be within the linear operating range of the forward output of the forward module. Each reverse output of each reverse module produces a reverse output signal driving its own summing input to the summing module. The reverse inputs of all reverse modules are driven by the forward output signal So which remains the conditioned embodiment output. The net conditioning result is similar to the previous embodiment except there is a different input-to-output transfer function for each reverse module employed. As threshold values are exceeded by the forward output signal So magnitude (increasing from So1 to So2 to . . . So[n]), the input-to-output transfer function or gain that produces the forward output signal So due to the input signal Si changes from Af to 1/(Ar1+1/Af) to 1/(Ar1+Ar2+1/Af) and so forth ending up equal to 1/(Ar1+Ar2+ . . . +Ar[n]+1/Af) where n is equal to the number of reverse modules.

Figure 16:
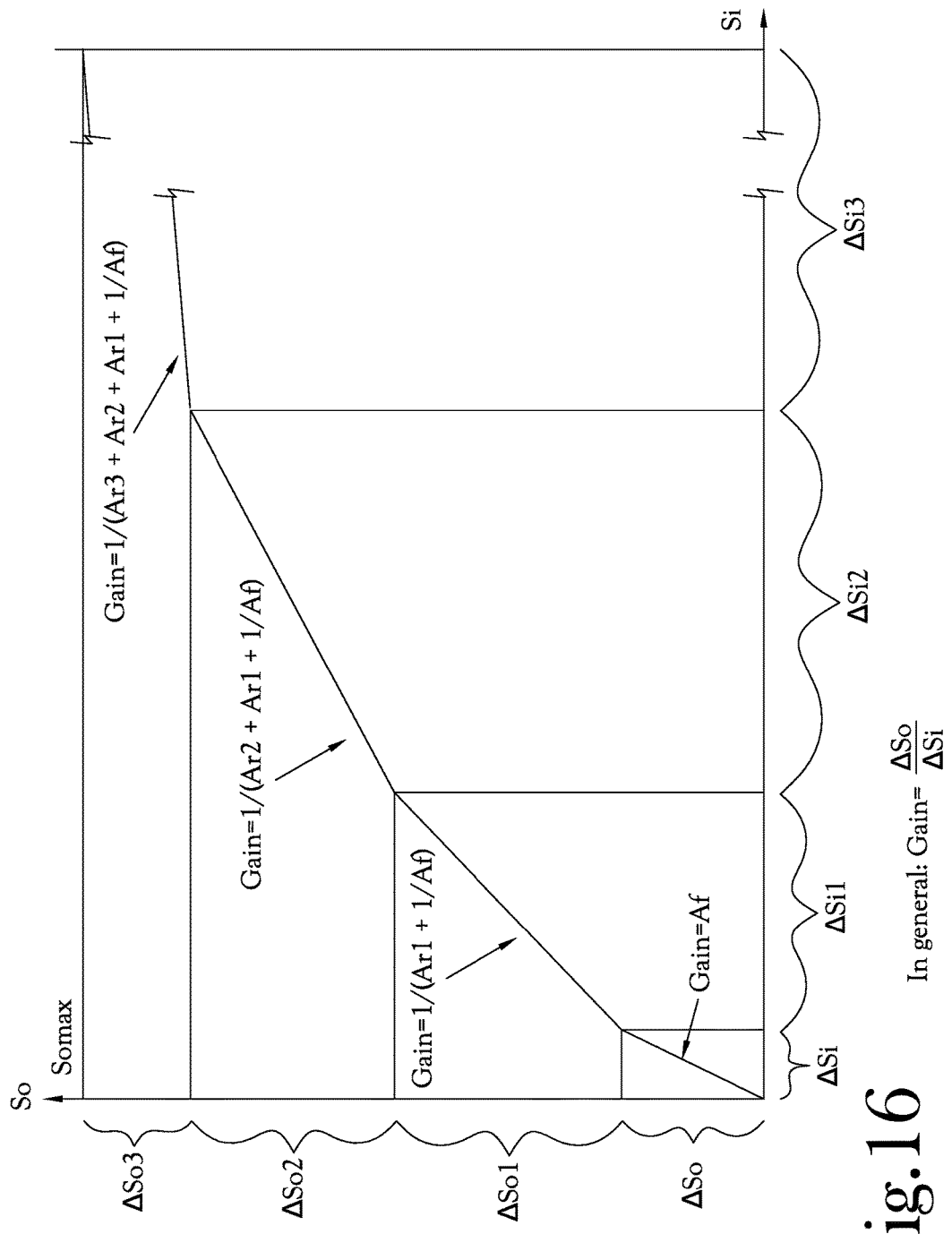
FIG. 16 illustrates a gain and output signal response according to changes in an input signal magnitude in the example embodiment circuit illustrated in FIG. 15.

FIG. 16 illustrates a gain and output signal response according to changes in an input signal magnitude in the example embodiment circuit illustrated in FIG. 3. FIG. 16 shows the FIG. 15 embodiment input-to-output relationship for n equal to 3 reverse modules by plotting the forward output So versus the input signal Si. At each point where the forward output signal So magnitude substantially instantaneously exceeds a reverse module threshold value, a different transfer function or gain is created for the embodiment input-to-output relationship indicated in FIG. 16 as a decrease in the slope of the line relating the forward output signal So to the input signal Si.

Herein, all referenced impedances and transfer functions, including transimpedances, are functions of the complex frequency variable "s" from the Laplace Transform. This may also be referred to as a representation of the s-domain function.

In regard to various circuit elements discussed in relation to FIGS. 3-5, another example embodiment of the present general inventive concept may provide a precision analog signal conditioning method that uses the low range circuit described above wherein additional resistances (Rfpr, Rpr1, Rpr2) and/or (Rov1, Rov2, Rflv1) and (Riv, Rfhv, Rflv1, Rflv2, Rov1, Rov2, Rfpr, Rpr1, Rpr2) may be combined onto resistor arrays with tighter nominal tolerances to improve accuracy, initially and over temperature, and wherein additional frequency dependent passive and/or active components may be added to provide additional circuit stability and/or phase compensation and/or improved frequency response.

Another example embodiment of the present general inventive concept may provide a precision analog signal conditioning method that operates over a broad range of input signal amplitudes and temperatures to produce high accuracy without requiring temperature effects compensation by implementing a signal conditioning circuit including a sub-circuit having a first high precision resistor (Riv) in series with the input signal (Viv), and a second high precision resistor (Rfhv) in feedback to a first op-amp (U1) producing an output signal (Vohv), where Riv and Rfhv constitute a high precision resistor array, wherein the sub-circuit has an input range of at least 2 decades and produces an output signal (Vohv) which differs from the ideal nominal transfer function by an error no greater than the combined errors of the high precision resistances from their specified nominal values.

Another example embodiment of the present general inventive concept may provide a precision analog signal conditioning method that operates over several orders of magnitude of input signal amplitudes and temperatures to produce high accuracy without requiring temperature effects compensation, including the low range active analog signal conditioning circuit described above, and the high range analog signal conditioning described above, and a switching mechanism whereby either the high range output signal (Vohv) may be selected by simultaneously interrupting the error correction signal (Vc) from op-amp U3 and connecting the Rfhv resistor to be the feedback resistor of op-amp U1, or the low range output signal (Volv) may be selected by simultaneously open-circuiting the Rfhv resistor and allowing the error correction signal (Vc) to reach the input of op-amp U1.

According to another example embodiment of the present general inventive concept, an active analog signal conditioning circuit may include an input signal node to receive an input signal, an output signal node to output an output signal, a reference signal node to output a reference signal, an error correction signal node to output an error correction signal, a forward module configured to condition and sum the input signal and the error correction signal to present the output signal at the output signal node such that the input signal is applied to a first forward sensitivity between the input signal node and the output signal node, and the error correction signal is applied to a second forward sensitivity between the error correction signal node and the output signal node, a reference module configured to condition and sum the output signal and the error correction signal to present the reference signal at the reference signal node such that the reference signal is inverted in sign to the output signal, the output signal is applied to a first reference sensitivity between the output signal node and the reference signal node, and the error correction signal is applied to a second reference sensitivity between the error correction signal node and the reference signal node and a correcting comparison module configured to condition and sum the output signal and the reference signal to present the error correction signal at the error correction signal node such that the output signal is applied to a first comparison sensitivity between the output signal node and the error correction signal node, and the reference signal is applied to a second comparison sensitivity between the reference signal node and the error correction signal node, wherein the second forward sensitivity and the first and second reference sensitivities are configured such that error correction signal components of the reference signal from the respective first and second reference sensitivities are equal in magnitude and inverted in sign, and wherein the forward module and the reference module are configured to each include at least one passive element formed on a same first substrate.

The active analog signal conditioning circuit may be configured to operate over a range of orders of magnitude of input signal amplitudes and/or operating temperatures to produce a signal conditioning accuracy on the order of a matching accuracy of impedances of a plurality of electrical elements respectively manufactured on a same thermally conductive substrate without requiring adjustment for errors initially and/or over temperature. The correcting comparison module may be configured to make an amplified comparison of the output signal and the reference signal with a weighting substantially equivalent to a nominal value of the first reference sensitivity.

The forward module may include a forward module input resistance and a forward module feedback resistance, and the reference module may include a reference module input resistance in series with, and formed on the same substrate with, the forward module feedback resistance, wherein the active analog signal conditioning circuit may be configured to have a low input range of at least 2 decades, and such that the output signal differs from a magnitude of an ideal nominal transfer function, the transfer function being the forward module feedback resistance divided by the forward module input resistance, by an error on the order of a tracking error between the forward module feedback resistance and the reference module input resistance, regardless of an absolute error between actual resistances and specified nominal resistances of the forward module feedback resistance and the reference module input resistance. The forward module feedback resistance and the reference module input resistance may be formed as a low precision resistor array on a thermally conductive substrate. The forward module feedback resistance and the reference module input resistance may have substantially equivalent resistances. The forward module input resistance may be formed as a high precision input resistor in series with the input signal node. The forward module may further include a forward module op-amp, and the forward module feedback resistance may be configured in feedback with the forward module op-amp to produce the output signal.

The reference module may further include a reference module op-amp, and a reference module feedback resistor configured in feedback with the reference module op-amp to produce the reference signal. The reference signal may be produced with a magnitude of a transfer function, the transfer function being the reference module feedback resistor divided by the forward module input resistance, and inverted relative to the output signal, when the forward module feedback resistor and the reference module input resistance have substantially equal impedances.

The correcting comparison module may include a first high precision comparison resistor to receive the reference signal, a second high precision comparison resistor to receive the output signal, and a correcting comparison module op-amp, wherein the first high precision comparison resistor and the second high precision comparison resistor may be configured to deliver a weighted sum of the reference signal and the output signal to be amplified by the correcting comparison module op-amp to produce the error correction signal. The first high precision comparison resistor and the second high precision comparison resistor may be formed adjacently on a same second substrate as a high precision comparison resistor array. A ratio of the second high precision comparison resistor to the first high precision comparison resistor may be substantially equivalent to a ratio of a nominal specified value of the forward module feedback resistance to the reference module feedback resistor, initially and over temperature. The active analog signal conditioning circuit may be configured such that the error correction signal corrects the output signal for absolute errors of the forward module feedback resistance and without changing the reference signal by using a plurality of feedback paths so a transfer function contribution from a first signal path to the reference signal by the error correction signal is substantially equal in magnitude and inverted in sign as a second signal path such that the error correction signal has substantially zero effect on the reference signal. In other words, the second forward sensitivity multiplied by, or cascaded with, the first reference sensitivity may be equal in magnitude and negative to the second reference sensitivity. This is due to Rpr1 375 being equal to Rpr2 376 in the circuit, as shown in the example embodiment illustrated in FIG. 5.

The forward module may further include a first error correction resistance, the reference module may further include a second error correction resistance, and the first error correction resistance and the second error correction resistance may be high precision resistances formed adjacently on a same third substrate. The first signal path of the error correction signal may be configured through the second forward sensitivity including the first error correction resistance and the forward module feedback resistance, and through the first reference sensitivity including the reference module input resistance and the reference module feedback resistor, the second signal path of the error correction signal may be configured through the second reference sensitivity including the second error correction resistance and the reference module feedback resistor, and the first and second signal paths may be configured such that each results in equal magnitude signals with opposite signs so as to cancel a contribution of the error correction signal to the reference signal output by the reference module. The reference module feedback resistor may be formed on the same third substrate with the first error correction resistance and the second error correction resistance. The active analog signal conditioning circuit may further include one or more additional frequency dependent passive and/or active components configured to provide additional circuit stability, phase compensation, or improved frequency response.

The active analog signal conditioning circuit may further include a signal conditioning circuit including a high signal path resistor configured in series with the forward module input resistance and in feedback to the forward module op-amp to produce a high range output signal, wherein the high signal path resistor and the forward module input resistance may be high precision resistors formed in an array on a same fourth substrate. The signal conditioning circuit may be configured to have a high input range of at least 2 decades, and such that the high output signal differs from a magnitude of an ideal nominal transfer function, the transfer function being the high signal path resistor divided by the forward module input resistance, by an error no greater than the combined errors of the values of the forward module input resistance and the high signal path resistor from their specified nominal values. The active analog signal conditioning circuit may be configured such that the high input range of at least 2 decades is utilized for signals higher than the low input range of at least 2 decades.

The active analog signal conditioning circuit may further include a switching module configured to switch the active analog signal conditioning circuit between the low input range and the high input range by substantially simultaneously interrupting the error correction signal from the correcting comparison module op-amp and changing the forward feedback resistance, and thereby the first forward sensitivity, to activate the high input range, and by substantially simultaneously restoring the error correction signal from the correcting comparison module op-amp and bypassing the high signal path resistor, and thereby changing the first forward sensitivity, to activate the low input range. The high signal path resistor may be connected between the forward module input resistance and the output signal node by closing a switch between the high signal path resistor and the output signal node, thereby changing the first forward sensitivity, and the high signal path resistor may be bypassed by opening the switch between the high signal path resistor and the output signal node. A value of the forward module feedback resistance may be approximately two orders of magnitude higher than a value of the high signal path resistor.

The error correction signal from the correcting comparison module op-amp may be interrupted by opening a switch provided between the correcting comparison module op-amp and the error correction signal node, and the error correction signal from the correcting comparison module op-amp may be restored by closing the switch provided between the correcting comparison module op-amp and the error correction signal node.

In another example embodiment, the forward module may include a forward module feedback resistance, the reference module may include a reference module input resistance in series with, and formed on the same substrate with, the forward module feedback resistance, and the active analog signal conditioning circuit may be configured to have an input range of at least 2 decades, and such that the output signal differs from a magnitude of an ideal nominal transfer function, the transfer function being the forward module feedback resistance, by an error on the order of a tracking error between the forward module feedback resistance and the reference module input resistance, regardless of an absolute error between actual resistances and specified nominal resistances of the forward module feedback resistance and the reference module input resistance.

According to another example embodiment of the present general inventive concept, a method of active analog signal conditioning includes receiving an input signal at an input signal node, outputting an output signal as a conditioned signal to an output signal node, outputting a reference signal to a reference signal node, outputting an error correction signal to an error correction signal node, conditioning and summing the input signal and the error correction signal through a forward module to present the output signal at the output signal node by applying the input signal to a first forward sensitivity between the input signal node and the output signal node, and applying the error correction signal to a second forward sensitivity between the error correction signal node and the output signal node, conditioning and summing the output signal and the error correction signal through a reference module to present the reference signal at the reference signal node, such that the reference signal is inverted in sign to the output signal, by applying the output signal to a first reference sensitivity between the output signal node and the reference signal node, and applying the error correction signal to a second reference sensitivity between the error correction signal node and the reference signal node, and conditioning and summing the output signal and the reference signal through a correcting comparison module to present the error correction signal at the error correction signal node by applying the output signal to a first comparison sensitivity between the output signal node and the error correction signal node, and applying the reference signal to a second comparison sensitivity between the reference signal node and the error correction signal node, wherein the second forward sensitivity and the first and second reference sensitivities are configured such that error correction signal components of the reference signal from the respective first and second reference sensitivities are equal in magnitude and inverted in sign, and wherein the forward module and the reference module each include at least one passive element formed on a same first substrate.

The method may further include making an amplified comparison, in the correcting comparison module, of the output signal and the reference signal with a weighting substantially equivalent to a nominal value of the first reference sensitivity. The reference signal may be produced with a magnitude of a transfer function, the transfer function being the reference module feedback resistor divided by the forward module input resistance, and inverted relative to the output signal, when the forward module feedback resistor and the reference module input resistance have substantially equal impedances. The method may further include correcting the output signal, using the error correction signal, for absolute errors of the forward module feedback resistance and without changing the reference signal by using a plurality of feedback paths so a transfer function contribution from a first signal path to the reference signal by the error correction signal is substantially equal in magnitude and inverted in sign as a second signal path such that the error correction signal has substantially zero effect on the reference signal.

The method may further include producing a high range output signal through a passive signal conditioning circuit including a high signal path resistor configured in series with the forward module input resistance and in feedback to the forward module op-amp, wherein the high signal path resistor and the forward module input resistance are high precision resistors formed in an array on a same fourth substrate. The method may further include utilizing the high signal path resistor for a high input range of at least 2 decades, and bypassing the high signal path resistor for a low input range, the low input range being of at least 2 decades. The method may further include switching between the low input range and the high input range by substantially simultaneously interrupting the error correction signal from the correcting comparison module op-amp and changing the forward feedback resistance, and thereby the first forward sensitivity, to activate the high input range, and by substantially simultaneously restoring the error correction signal from the correcting comparison module op-amp and bypassing the high signal path resistor, and thereby changing the first forward sensitivity, to activate the low input range. The method may further include switching to the high input range by closing a switch between the high signal path resistor and the output signal node to connect the high signal path resistor between the forward module input resistance and the output signal node, thereby changing the first forward sensitivity, and switching to the low input range by opening the switch between the high signal path resistor and the output signal node to bypass the high signal path resistor. Switching to the high input range may further include opening a switch provided between the correcting comparison module op-amp and the error correction signal node to interrupt the error correction signal from the correcting comparison module op-amp, and switching to the low input range may further include closing the switch provided between the correcting comparison module op-amp and the error correction signal node to restore the error correction signal from the correcting comparison module op-amp.

As discussed in reference to FIGS. 2-5, an example embodiment of the present general inventive concept may provide a saturation prevention electrical signal conditioning method for substantially instantaneously converting either a voltage or an electrical current type of an input electrical signal to a forward output electrical signal with good accuracy of reading over a range of several orders of magnitude without saturation including a forward signal conditioning including a forward input and a forward output configured to have a total forward gain-bandwidth product and an inverting forward gain defined as a ratio of magnitudes of forward output to forward input electrical signals, an input summation function with a first sum input coupled to a source of electrical signal and a total sum output coupled to the forward input of the forward signal conditioning, an overall output coupled to the forward output of the forward signal conditioning that produces the forward output electrical signal representing a conditioned instantaneous analogue of a forward input electrical signal multiplied by the inverting forward gain with good accuracy of reading when a range of magnitudes of the forward output electrical signal on the forward output is within a predetermined lower region of a linear operating electrical signal range of the forward output of the forward signal conditioning in both positive and negative senses, and a reverse signal conditioning including a reverse input and a reverse output configured to have a total reverse gain-bandwidth product and a non-inverting reverse gain defined as a ratio of magnitudes of reverse output to reverse input electrical signals, wherein the reverse signal conditioning is configured in anti-parallel with the forward signal conditioning by coupling the reverse input of the reverse signal conditioning to the overall output and by coupling the reverse output of the reverse signal conditioning to a second sum input of the input summation function, wherein the output of the input summation function produces the forward input electrical signal thereby applied to the forward input, wherein the first sum input of the input summation function exhibits an input impedance that is either substantially zero ohms if the input electrical signal is an input electrical current signal or substantially infinite ohms if the input electrical signal is an input voltage signal such that the input electrical signal is processed by the first sum input with substantially zero dissipation of electrical power from the source of electrical signal, wherein the reverse signal conditioning is configured such that the reverse output of the reverse signal conditioning begins to produce a reverse output electrical signal only when the forward output electrical signal on the overall output just exceeds an upper signal magnitude set by the predetermined lower region of the linear operating electrical signal range in both positive and negative senses, wherein the reverse signal conditioning is also configured such that the reverse output electrical signal increases in proportion to a forward output difference electrical signal magnitude defined as the upper signal magnitude subtracted from the forward output electrical signal in both positive and negative senses, wherein the reverse output electrical signal is equal to the forward output difference electrical signal multiplied by the non-inverting reverse gain, wherein the reverse output electrical signal, when non-zero, subtracts from the input electrical signal due to both the input node summation function and the inverting forward gain thereby reducing further increase of the forward input electrical signal on the output of the input summing function, wherein the forward output electrical signal is the conditioned instantaneous analogue of the input electrical signal multiplied by the inverting forward gain when the forward output electrical signal is within the predetermined lower region in both positive and negative senses of the linear operating electrical signal range of the forward output of the forward signal conditioning, and wherein changes in magnitude of the forward output electrical signal are equal to changes in magnitude of the input electrical signal divided by the sum the non-inverting reverse gain magnitude and of the reciprocal of the inverting forward gain magnitude whenever the forward output electrical signal is above the predetermined lower region in both positive and negative senses of the linear operating electrical signal range of the forward output of the forward signal conditioning, wherein the inverting forward gain and the non-inverting reverse gain produce the forward output electrical signal and the reverse output electrical signals, respectively, that are inverted relative to the input electrical signal.

Another example embodiment of such a saturation prevention electrical signal conditioning method may include the forward signal conditioning having a non-inverting forward gain to replace the inverting forward gain discussed above, and the reverse signal conditioning having an inverting reverse gain to replace the non-inverting reverse gain discussed above, wherein the non-inverting forward gain produces the forward output electrical signal non-inverted relative to the input electrical signal, and wherein the inverting reverse gain produces the reverse output electrical signal inverted relative to the input electrical signal.

The saturation prevention electrical signal conditioning method may include a plurality of N reverse signal conditioning sections replacing the reverse signal conditioning discussed above and having one each of a plurality of N predetermined overlapping lower portions, respectively, of the linear operating electrical signal range of the forward output of the forward signal conditioning section operation within thereof determined by the forward output electrical signal substantially instantaneous magnitude, an N+1 input summing function replacing the input summation function discussed above and having a plurality of N+1 sum inputs with a first sum input coupled to the source of electrical signal and a total sum output coupled to the forward input of the forward signal conditioning, wherein the total sum output of the N+1 input summing function generates the forward input electrical signal, wherein an $n^{th}$ corresponds to a specific element of a plurality of N set such that the least value of N is two and the maximum value of N is theoretically unlimited, wherein the value of N=1 produces the saturation prevention electrical signal conditioning method discussed above, wherein the plurality of N predetermined overlapping lower portions of the linear operating electrical signal range each extending from substantially zero to the $n^{th}$ of a plurality of N increasing upper signal magnitudes taken on by the forward output electrical signal in both the positive and negative senses, wherein the $n^{th}$ of the plurality of N reverse signal conditioning sections operation is respectively characterized by the $n^{th}$ of a plurality of N non-inverting reverse gains, wherein the $n^{th}$ of the plurality of N reverse signal conditioning sections generate the $n^{th}$ of a plurality of N reverse output electrical signals which is the conditioned instantaneous analogue of the forward output electrical signal multiplied by the $n^{th}$ of the plurality of N non-inverting reverse gains magnitude ONLY AFTER the forward output electrical signal magnitude exceeds respectively the $n^{th}$ of the plurality of N increasing upper signal magnitudes in both the positive and negative senses, wherein the forward output electrical signal is the conditioned instantaneous analogue of the input electrical signal multiplied by the inverting forward gain when the forward output electrical signal magnitude is less than or equal to a lowest magnitude of the plurality of N upper signal magnitudes in both the positive and negative senses, wherein changes in magnitude of the forward output electrical signal are equal to changes in magnitude of the input electrical signal divided by: (a) sum through the $n^{th}$ of the plurality of N non-inverting reverse gains magnitudes added to (b) the reciprocal of the inverting forward gain magnitude whenever the forward output electrical signal magnitude is greater than the $n^{th}$ and, if the $n^{th}$ is less than N, is less than the $n^{th}$ plus one of the plurality of N upper signal magnitudes in both positive and negative senses, and wherein the inverting forward gain and the non-inverting reverse gain produce the forward output electrical signal and the plurality of N reverse output electrical signals, respectively, that are inverted relative to the input electrical signal.

The saturation prevention electrical signal conditioning method may include the forward signal conditioning having a non-inverting forward gain to replace the inverting forward gain discussed above, and the plurality of N reverse signal conditioning having respectively a plurality of N inverting reverse gains to replace the plurality of N non-inverting reverse gains discussed above, wherein the non-inverting forward gain produces the forward output electrical signal non-inverted relative to the input electrical signal, and wherein the inverting reverse gain produces the plurality of N reverse output electrical signals that are inverted relative to the input electrical signal.

Another example embodiment of the saturation prevention electrical current signal conditioning system for substantially instantaneously converting without saturation a forward input electrical current to a forward output voltage with good accuracy of reading over a range of several orders of magnitude may include a forward plurality of amplifiers and passives configured in a forward arrangement including a forward last amplifier and a forward first amplifier configured to have a total forward gain-bandwidth product and an inverting forward gain defined as a ratio of magnitudes of forward output to forward input electrical signals, an input node coupled to both a source of electrical current to be conditioned and to a forward input of the forward first amplifier of the forward arrangement, an output node coupled to a forward output of the forward last amplifier within the forward arrangement that produces a forward output voltage representing a conditioned instantaneous analogue of the forward input electrical current produced by the source of electrical current with good accuracy of reading when a range of magnitudes of the forward output voltage on the output node is within a predetermined lower region of a linear operating voltage range of the forward last amplifier, a feedback impedance having a feedback magnitude coupled in parallel with the forward arrangement between the input node and the output node, a reverse plurality of amplifiers and passives configured in a reverse arrangement including a reverse last amplifier and a reverse first amplifier configured to have a total reverse gain-bandwidth product and a non-inverting reverse gain defined as a ratio of magnitudes of reverse output to reverse input electrical signals, a reverse impedance having a reverse magnitude coupled in series between a reverse output of the reverse last amplifier within the reverse arrangement and the input node, wherein the reverse arrangement is coupled in anti-parallel with the forward arrangement by coupling a reverse input of the reverse first amplifier of the reverse arrangement to the output node since the reverse impedance is coupled to the input node, wherein the total forward voltage gain-bandwidth product of the forward arrangement is sufficiently large to pull through the feedback impedance substantially all flow of either the forward input electrical current or a net forward input electrical current entering the input node such that the feedback magnitude of the feedback impedance substantially determines a maximum transimpedance that produces the forward output voltage on the output node responsive to either the forward input electrical current or the net forward input electrical current, wherein the reverse arrangement is configured such that the reverse output of the reverse last amplifier in the reverse arrangement does not produce a reverse output voltage until the forward output voltage on the output node exceeds the range of magnitudes corresponding to the predetermined lower region of the linear operating voltage range of the forward last amplifier, wherein the reverse impedance of the reverse arrangement has the reverse magnitude that is smaller than the feedback magnitude of the feedback impedance and converts the reverse output voltage of the reverse output of the reverse last amplifier to a reverse input electrical current flowing into the input node, wherein the reverse arrangement is also configured such that, after the forward output voltage on the output node exceeds the predetermined lower region of the linear operating voltage range of the forward last amplifier, both the reverse output voltage and thereby also the reverse input electrical current thereafter increase in proportion to the forward output voltage on the output node, and wherein the reverse input electrical current, produced as indicated by the forward output voltage exceeding the predetermined lower region of the linear operating voltage range of the forward last amplifier, combines with the forward input electrical current produced by the source of electrical current to create the net forward input electrical current thereby creating the forward output voltage responsive to the forward input electrical current such that a ratio of the forward output voltage to the forward input electrical current is a minimum transimpedance substantially equal to the reverse magnitude divided by the total reverse voltage gain when the feedback magnitude of the feedback impedance is much greater than the reverse magnitude of the reverse impedance. The reverse impedance may include a fixed impedance series coupled to an anti-parallel diode pair such that, when the forward output voltage on the output node is within the predetermined lower region of the linear operating voltage range of the forward last amplifier, a total noise and offset voltage generated by the reverse arrangement is substantially prevented from producing an unwanted noise and offset electrical current that would otherwise enter the input node. A root of the mean of the squared waveform voltage amplitude of a sine waveform fundamental of the forward input electrical current may be calculated from a zero-volts crossing slope of the sine waveform fundamental in engineering units of volts per seconds by dividing the zero-volts crossing slope by a product of square root of numeral 2, numeral 2, pi, and an alternating frequency of the sine waveform fundamental in engineering units of Hertz.

The reverse first amplifier may be configured such that the reverse arrangement includes a voltage amplifier having a positive input, a negative input, and a local voltage output with a second linear operating voltage range configured such that the positive input is coupled to a system zero-volt common, an input impedance connected between the output node of the saturation prevention signal conditioning method and the negative input of the voltage amplifier, and a local feedback impedance connected between the negative input and the voltage output of the voltage amplifier, wherein a voltage gain-setting ratio determined by the local feedback impedance divided by the input impedance is set such that the voltage output of the voltage amplifier produces a maximum voltage in either negative or positive sense determined by the second linear operating voltage range when the forward output voltage is at the top of the predetermined lower region of the linear operating voltage range of the forward last amplifier, wherein, whenever the voltage output is below the maximum voltage in either the positive or negative sense, a negative input voltage on the negative input of the voltage amplifier remains substantially zero volts, wherein, whenever the voltage output is equal to the maximum voltage in either positive or negative sense, additional increase in the forward output voltage produces proportionate increase in the negative input voltage on the negative input of the voltage amplifier, and wherein the reverse arrangement is configured such that the negative input voltage on the negative input of the voltage amplifier ultimately and proportionately produces the reverse input electrical current that flows through the reverse impedance of the saturation prevention signal conditioning method. An isolated DC bipolar power supply may be used to power the saturation prevention signal conditioning method and is configured such that the isolated DC bipolar power supply is adequately isolated from the source of electrical current such that the input node and the system zero-volt common node can be coupled in series into any opening at any point along the source of electrical current circuit.

An example embodiment of a combination electrical current signal conditioning system for substantially instantaneously conditioning an electrical current over the range of several orders of magnitude of a conditioned electrical current may include a current transformer and the saturation prevention electrical current signal conditioning system modified as specified above, wherein the input node of the saturation prevention signal conditioning method is coupled to a first node of a secondary winding of the current transformer and a second node of the secondary winding of the current transformer coupled to the system zero-volt common, wherein the forward input electrical current of the saturation prevention signal conditioning method is a secondary winding current of the current transformer and a primary winding current of the current transformer is the conditioned current, and wherein the conditioned electrical current is substantially instantaneously greater than the forward input electrical current by a factor of secondary winding turns to primary winding turns ratio of the current transformer. The current transformer may have a magnetic core engineered to have maximally high permeability and minimally low loss characteristics.

Another example embodiment of a combination electrical current signal conditioning system for substantially instantaneously conditioning electrical current over the range of several orders of magnitude of the conditioned electrical current may include the current transformer, the saturation prevention electrical current signal conditioning method modified as specified above, and a high range transimpedance current conditioning system including a second forward plurality of amplifiers and passives configured in a second forward arrangement including a second forward last amplifier and a second forward first amplifier configured to have a second total forward gain-bandwidth product and a second inverting forward gain that is defined as a second ratio of magnitudes of forward output to forward input electrical signals, a second input node coupled to both the second node of the secondary winding of the current transformer to be conditioned and to a second forward input of the second forward first amplifier of the second forward arrangement, a second output node coupled to a second forward output of the second forward last amplifier within the second forward arrangement that produces a second forward output voltage representing a second conditioned instantaneous analogue of the forward input electrical current with good accuracy of reading when the forward input electrical current is within a predetermined upper portion that is equivalent to the range of several orders of magnitude not corresponding to the predetermined lower region of the linear operating voltage range of the forward last amplifier, and a second feedback impedance having a second feedback magnitude coupled in parallel with the second forward arrangement between the second input node and the second output node, wherein the input node of the saturation prevention signal conditioning method is coupled to the first node of the secondary winding of the current transformer, wherein the second total forward voltage gain-bandwidth product of the second forward arrangement is sufficiently large to pull through the second feedback impedance substantially all flow of the forward input electrical current entering the second input node such that the second feedback magnitude of the second feedback impedance substantially determines a high range transimpedance that produces the second forward output voltage on the second output node responsive to the forward input electrical current, and wherein the forward input electrical current of the saturation prevention signal conditioning method is a secondary winding current of the current transformer and a primary winding current of the current transformer is the conditioned current, and wherein the conditioned electrical current is substantially instantaneously greater than the forward input electrical current by the factor of secondary winding turns to primary winding turns ratio of the current transformer.

Another combination electrical current signal conditioning system for substantially instantaneously conditioning electrical current over the range of several orders of magnitude of the conditioned electrical current may include the saturation prevention signal conditioning method modified as specified above; and the high range transimpedance current conditioning system discussed above including a second system zero-volt common isolated from the system zero-volt common of the saturation prevention signal conditioning method, and a second isolated DC bipolar power supply coupled to the second system zero-volt common for providing power to the high range transimpedance current conditioning system, except the input node is not coupled to the first node of the secondary winding of the current transformer, except the second input node is not coupled to the second node of the secondary winding of the current transformer; except the forward input electrical current of the saturation prevention signal conditioning method is not the secondary winding current of the current transformer and the primary winding current of the current transformer is not the conditioned current, except the conditioned electrical current is not greater than the forward input electrical current, wherein the second isolated DC bipolar power supply is adequately isolated from both the source of electrical current and the isolated DC bipolar power supply powering the saturation prevention signal conditioning method such that the input node and the system zero-volt common node pair are coupled in series with the second input node and the second system zero-volt common node pair into any opening at any point along the source of electrical current circuit so that the saturation prevention signal conditioning method and the high range transimpedance current conditioning system receive the forward input electrical current, and wherein the conditioned electrical current is equal to the forward input electrical current.

The feedback impedance may include a precision resistor and a capacitor, wherein the precision resistor sets the DC to low frequency effective transimpedance and has very small room temperature value tolerance and small temperature coefficient of resistance characteristics, wherein the capacitor reduces noise bandwidth and participates in system compensation.

The feedback impedance may include a precision resistor and a capacitor, wherein the precision resistor sets the DC to low frequency effective transimpedance and has very small room temperature value tolerance and small temperature coefficient of resistance characteristics, wherein the capacitor reduces noise bandwidth and participates in system compensation, wherein the second feedback impedance is comprised of a second precision resistor and a second capacitor, wherein the second precision resistor sets the DC to low frequency effective transimpedance and has very small room temperature value tolerance and small temperature coefficient of resistance characteristics, wherein the second capacitor reduces noise bandwidth and participates in system compensation.

According to another example embodiment of the present general inventive concept, a signal conditioning circuit may include a forward module having a forward input to receive a forward input electrical signal and a forward output to output a forward output electrical signal, the forward module being configured to have a substantially instantaneous response and an inverting forward gain defined as a ratio of magnitudes of forward output electrical signals to forward input electrical signals, an input summation module including a first sum input coupled to a source of an electrical signal, a second sum input, and a total sum output coupled to the forward input of the forward module to produce the forward input electrical signal, and a reverse module including a reverse input and a reverse output, the reverse module being configured in anti-parallel with the forward module by coupling the reverse input to the forward output and by coupling the reverse output to the second sum input, and to have a substantially instantaneous response and a non-inverting reverse gain defined as a ratio of magnitudes of reverse output electrical signals to reverse input electrical signals, wherein the forward output electrical signal represents an analogue of the forward input electrical signal multiplied by the inverting forward gain when a magnitude of the forward output electrical signal is within a predetermined region of a linear operating range of the forward module.

The predetermined region may have a threshold value equal to a predetermined percentage of the linear operating range. The first sum input may exhibit an impedance of substantially zero ohms if the input electrical signal is an input electrical current signal, and of substantially infinite ohms if the input electrical signal is an input voltage signal.

The reverse module may be configured such that reverse output produces a reverse output electrical signal only when the magnitude of the forward output electrical signal exceeds the threshold value. The reverse module may be configured such that the reverse output electrical signal increases in proportion to a difference between the threshold value and the magnitude of the forward output electrical signal. The reverse output electrical signal is equal to the difference between the threshold value and the magnitude of the forward output electrical signal multiplied by the non-inverting reverse gain. The reverse output electrical signal, when non-zero, subtracts from the input electrical signal through the input summation module to reduce an increase of the forward input electrical signal.

Changes in magnitude of the forward output electrical signal may be equal to changes in magnitude of the input electrical signal divided by the sum of the non-inverting reverse gain magnitude and of the reciprocal of the inverting forward gain magnitude whenever the magnitude of the forward output electrical signal is above the threshold value. The inverting forward gain and the non-inverting reverse gain may produce the forward output electrical signal and the reverse output electrical signal, respectively, the forward output electrical signal and the reverse output electrical signal being inverted relative to the input electrical signal. The inverting forward gain of the forward module may be a non-inverting forward gain, and the non-inverting reverse gain of the reverse module may be an inverting gain, such that the forward module produces the forward output electrical signal non-inverted relative to the input electrical signal, and the reverse module produces the reverse output electrical signal inverted relative to the input electrical signal.

The reverse module may include a plurality of N reverse modules to produce N reverse output electrical signals such that the total sum output is a summation of N+1 signal values, being the N reverse output electrical signals summed with the input signal from the source to form the forward input electrical signal. The N reverse modules may be configured to correspond to N threshold values, each corresponding to an increasing forward output signal magnitude and each within the linear operating range of the forward module, such that as each of the respective threshold values of the N reverse modules are exceeded by the increasing forward output signal magnitude, the gain is changed by adding a next one of the N reverse modules having a next sequential threshold value.

According to another example embodiment of the present general inventive concept, a signal conditioning circuit may include an input node to receive an input signal, an output node, a forward module coupled between the input node and the output node, the forward module being configured to amplify and invert the input signal and to present a forward output signal to the output node, the forward output signal being an analogue of the input signal, and a reverse module coupled in anti-parallel with the forward module between the output node and the input node to receive the forward output signal as a reverse input signal and to present a reverse output signal to the input node, wherein the reverse module is configured such that the reverse module does not present the reverse output signal to the input node until the forward output signal exceeds a predetermined magnitude based on a linear operating voltage range of the forward module.

The forward module may include a plurality of amplifiers and passive elements including a forward first amplifier and a forward last amplifier configured to have an inverting forward gain defined as a ratio of magnitudes of the forward output signal to the input signal, and wherein an input of the forward first amplifier is coupled to the input node and an output of the forward last amplifier is coupled to the output node. The forward module further may further include a feedback impedance coupled in parallel with the plurality of amplifiers between the input node and the output node.

The reverse module may include a plurality of amplifiers and passive elements including a reverse first amplifier and a reverse last amplifier to provide a non-inverting reverse gain defined as a ratio of magnitudes of the reverse output signal to the reverse input signal, wherein an input of the reverse first amplifier is coupled to the output node. The reverse module may further include a reverse impedance coupled in series between an output of the reverse last amplifier and the input node.

The forward module may be configured such that a magnitude of the feedback impedance determines a maximum transimpedance that produces the forward output signal.

The reverse impedance may be smaller than the feedback impedance of the forward module, and wherein the reverse impedance converts a reverse output voltage of the reverse last amplifier to a reverse output signal presented to the input node.

The reverse module may be configured such that after the forward output signal exceeds the predetermined magnitude, the reverse output signal presented to the input node increases in proportion to a difference between the forward output signal and the predetermined magnitude.

The predetermined magnitude may correspond to a predetermined lower region of a linear operating voltage range of the forward last amplifier.

The reverse output signal may combine with the input signal to form a net forward input signal to which a transfer function of the forward module is applied to produce the forward output signal. The input signal may be an input current, the forward output signal may be a forward output voltage, the reverse output signal may be a reverse output current, the net forward input signal may be a net forward input current, and the transfer function may be a transimpedance of the forward module, and the forward output voltage may be the net forward input current multiplied by the maximum transimpedance. The net forward input current may be equal to the input current when the forward output voltage is below the predetermined magnitude, and the net forward input current may be equal to a difference between the input current and the reverse output current when the forward output voltage is above the predetermined magnitude. When the forward output voltage exceeds the predetermined magnitude, the forward output voltage may be substantially equal to the input current divided by a sum of a reciprocal of the maximum transimpedance and a ratio of a total reverse voltage gain magnitude of the reverse module to a magnitude of the reverse impedance, wherein the sum is a reciprocal of the minimum transimpedance, and when the forward output voltage is less than the predetermined magnitude, the reverse output current may not present and the forward output voltage is equal to the product of the input current and the maximum transimpedance.

The reverse impedance may include a plurality of impedances connected in series to form a fixed impedance series, and an anti-parallel diode pair coupled between the input node and the fixed impedance series such that when the forward output signal does not exceed the predetermined signal magnitude, a total noise and offset voltage generated by the reverse module is substantially prevented from producing a noise and offset current to the input node.

A root of the mean of a squared waveform voltage amplitude of a sine waveform fundamental of the input signal may be calculated from a zero-volts crossing slope of the sine waveform fundamental, in engineering units of volts per seconds, by dividing the zero-volts crossing slope by a product of the square root of the numeral 2, the numeral 2, pi, and an alternating frequency of the sine waveform fundamental in engineering units of Hertz.

The reverse first amplifier may include a positive input, a negative input, and a local voltage output with a second linear operating voltage range configured such that the positive input is coupled to a system zero-volt common. The reverse module may further include an input impedance coupled between the output node and the negative input of the reverse first amplifier, and a local feedback impedance coupled between the negative input of the reverse first amplifier and the local voltage output of the reverse first amplifier, wherein a voltage gain-setting ratio magnitude determined by the local feedback impedance divided by the input impedance is configured such that the local voltage output of the reverse first amplifier produces a maximum voltage in absolute value determined by the second linear operating voltage range when the forward inverted gain signal exceeds the predetermined signal magnitude, wherein a negative input voltage on the negative input of the reverse first amplifier remains substantially zero whenever the local voltage output is below the maximum voltage in absolute value, wherein an increase in the forward output signal produces a proportionate increase in the negative input voltage on the negative input of the reverse first amplifier whenever the local voltage output is equal to the maximum voltage in absolute value, and wherein the reverse module is configured such that the negative input voltage on the negative input of the reverse first amplifier proportionately produces a reverse input current that flows through the reverse impedance.

The signal conditioning circuit may further include an isolated DC power supply that is isolated from the input signal such that the input node and a system zero-volt common may be coupled in series at any point along a circuit supplying the input signal.

The signal conditioning circuit may further include a current transformer having a primary winding to receive a conditioning current and a secondary winding to produce the input current such that a first node of the secondary winding is coupled to the input node and a second node of the secondary winding is coupled to a system zero-volt common, wherein the conditioning current is substantially instantaneously greater than the input current by a factor of a secondary winding turns to primary winding turns ratio of the current transformer. The signal conditioning circuit may further include a high range conditioning circuit including a second input node coupled to the second node of the secondary winding to receive the input signal, a second output node, and a second forward module coupled between the second input node and the second output node, the second forward module being configured to amplify and invert the input signal and to present a second forward output signal to the second output node, the second forward output signal being an analogue of the input signal when the input current is within a range that is multiple orders of magnitude not corresponding to the predetermined lower region of the linear voltage range of the forward last amplifier. The second forward module may include a second plurality of amplifiers and passive elements including a second forward first amplifier and a second forward last amplifier configured to have a second inverting forward gain that is defined as a second ratio of magnitudes of the second forward output signal to the input signal, wherein an input of the second forward first amplifier is coupled to the second input node and the second node of the secondary winding, and an output of the second forward last amplifier is coupled to the second output node. The second forward module may further include a second feedback impedance coupled in parallel with the second plurality of amplifiers between the second input node and the second output node. The second forward module may be configured such that a second feedback impedance of the second forward module determines a second maximum transimpedance that produces the second forward output signal.

The signal conditioning circuit may further include a high range conditioning circuit including a second input node to receive a second input signal, a second output node, and a second forward module coupled between the second input node and the second output node, the second forward module being configured to amplify the input signal and to present a second forward output signal to the second output node, the second forward output signal being an analogue of the input signal when the input current is within a range that is multiple orders of magnitude not corresponding to the predetermined lower region of the linear voltage range of the forward last amplifier. The signal conditioning circuit may further include a system zero-volt common, a DC power supply coupled to the system zero-volt common to provide power to a portion of the signal conditioning circuit not including the high-range conditioning circuit, a second system zero-volt common isolated from the other system zero-volt common, and a second DC power supply coupled to the second system zero-volt common to provide power to the high range conditioning circuit.

The feedback impedance may include a first precision resistor and/or a first compensation capacitor to reduce noise bandwidth, wherein the first precision resistor is configured to set a first DC to low frequency transimpedance. The second feedback impedance may include a second precision resistor and/or a second compensation capacitor to reduce noise bandwidth, wherein the second precision resistor is configured to set a second DC to low frequency transimpedance.

According to another example embodiment of the present general inventive concept, a method of conditioning a signal may include receiving a forward input electrical signal at a forward input of a forward module, and outputting a forward output electrical signal at a forward output of the forward module, the forward module being configured to have a substantially instantaneous response and an inverting forward gain defined as a ratio of magnitudes of forward output electrical signals to forward input electrical signals, receiving the forward output electrical signal at a reverse input of a reverse module, and outputting a reverse output electrical signal at a reverse output of the reverse module, the reverse module being configured in anti-parallel with the forward module by coupling the reverse input to the forward output and by coupling the reverse output to an input summation module coupled to the forward input, and to have a substantially instantaneous response and a non-inverting reverse gain defined as a ratio of magnitudes of reverse output electrical signals to reverse input electrical signals, and summing an electrical signal, received from a source of the electrical signal at a first sum input of the input summation module, with the reverse output electrical signal received at a second sum input of the input summation module to produce the forward input electrical signal at a total sum output of the input summation module coupled to the forward input of the forward module, wherein the forward output electrical signal represents an analogue of the forward input electrical signal multiplied by the inverting forward gain when a magnitude of the forward output electrical signal is within a predetermined region of a linear operating range of the forward module.

The predetermined region may have a threshold value equal to a predetermined percentage of the linear operating range. The first sum input may exhibit an impedance of substantially zero ohms if the input electrical signal is an input electrical current signal, and of substantially infinite ohms if the input electrical signal is an input voltage signal. The reverse output electrical signal may be produced only when the magnitude of the forward output electrical signal exceeds the threshold value. The reverse output electrical signal may increase in proportion to a difference between the threshold value and the magnitude of the forward output electrical signal. The reverse output electrical signal may be equal to the difference between the threshold value and the magnitude of the forward output electrical signal multiplied by the non-inverting reverse gain. The reverse output electrical signal, when non-zero, may subtract from the input electrical signal through the input summation module to reduce an increase of the forward input electrical signal.

Changes in magnitude of the forward output electrical signal may be equal to changes in magnitude of the input electrical signal divided by the sum of the non-inverting reverse gain magnitude and of the reciprocal of the inverting forward gain magnitude whenever the magnitude of the forward output electrical signal is above the threshold value.

The inverting forward gain and the non-inverting reverse gain may produce the forward output electrical signal and the reverse output electrical signal, respectively, the forward output electrical signal and the reverse output electrical signal being inverted relative to the input electrical signal. The inverting forward gain of the forward module may be a non-inverting forward gain, and the non-inverting reverse gain of the reverse module may be an inverting gain, such that the forward module produces the forward output electrical signal non-inverted relative to the input electrical signal, and the reverse module produces the reverse output electrical signal inverted relative to the input electrical signal.

According to another example embodiment of the present general inventive concept, a method of conditioning a signal may include receiving an input signal at an input node, amplifying and inverting the input signal, through a forward module coupled between the input node and an output node, to present a forward output signal at the output node, the forward output signal being an analogue of the input signal, and receiving the forward output signal as a reverse input signal at a reverse module coupled in anti-parallel with the forward module between the output node and the input node, and presenting a reverse output signal from the reverse module to the input node when the forward output signal exceeds a predetermined magnitude based on a linear operating range of the forward module. The forward module may include a plurality of amplifiers and passive elements including a forward first amplifier and a forward last amplifier configured to have an inverting forward gain defined as a ratio of magnitudes of the forward output signal to the input signal, and wherein an input of the forward first amplifier may be coupled to the input node and an output of the forward last amplifier is coupled to the output node, and wherein the reverse module may include a plurality of amplifiers and passive elements including a reverse first amplifier and a reverse last amplifier to provide a non-inverting reverse gain defined as a ratio of magnitudes of the reverse output signal to the reverse input signal, wherein an input of the reverse first amplifier may be coupled to the output node. In another embodiment, the forward module may include a plurality of amplifiers and passive elements including a forward first amplifier and a forward last amplifier configured to have a non-inverting forward gain defined as a ratio of magnitudes of the forward output signal to the input signal, and wherein an input of the forward first amplifier may be coupled to the input node and an output of the forward last amplifier may be coupled to the output node, and wherein the reverse module may include a plurality of amplifiers and passive elements including a reverse first amplifier and a reverse last amplifier to provide an inverting reverse gain defined as a ratio of magnitudes of the reverse output signal to the reverse input signal, wherein an input of the reverse first amplifier may be coupled to the output node.

It is noted that the simplified diagrams and drawings do not illustrate all the various connections and assemblies of the various components, however, those skilled in the art will understand how to implement such connections and assemblies, based on the illustrated components, figures, and descriptions provided herein, using sound engineering judgment.

Numerous variations, modifications, and additional embodiments are possible, and accordingly, all such variations, modifications, and embodiments are to be regarded as being within the spirit and scope of the present general inventive concept. For example, regardless of the content of any portion of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated.

While the present general inventive concept has been illustrated by description of several example embodiments, and while the illustrative embodiments have been described in detail, it is not the intention of the applicant to restrict or in any way limit the scope of the general inventive concept to such descriptions and illustrations. Instead, the descriptions, drawings, and claims herein are to be regarded as illustrative in nature, and not as restrictive, and additional embodiments will readily appear to those skilled in the art upon reading the above description and drawings. Additional modifications will readily appear to those skilled in the art. Accordingly, departures may be made from such details without departing from the spirit or scope of applicant's general inventive concept.

It is noted that the simplified diagrams and drawings do not illustrate all the various connections and assemblies of the various components, however, those skilled in the art will understand how to implement such connections and assemblies, based on the illustrated components, equivalent circuits, figures, and descriptions provided herein, using sound engineering judgment.

Numerous variations, modifications, and additional embodiments are possible, and accordingly, all such variations, modifications, and embodiments are to be regarded as being within the spirit and scope of the present general inventive concept. For example, regardless of the content of any portion of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated.

It is noted that the simplified diagrams and drawings included in the present application do not illustrate all the various connections and assemblies of the various components, however, those skilled in the art will understand how to implement such connections and assemblies, based on the illustrated components, figures, and descriptions provided herein. Numerous variations, modification, and additional embodiments are possible, and, accordingly, all such variations, modifications, and embodiments are to be regarded as being within the spirit and scope of the present general inventive concept.

While the present general inventive concept has been illustrated by description of several example embodiments, and while the illustrative embodiments have been described in detail, it is not the intention of the applicant to restrict or in any way limit the scope of the general inventive concept to such descriptions and illustrations. Instead, the descriptions, drawings, and claims herein are to be regarded as illustrative in nature, and not as restrictive, and additional embodiments will readily appear to those skilled in the art upon reading the above description and drawings. Additional modifications will readily appear to those skilled in the art. Accordingly, departures may be made from such details without departing from the spirit or scope of applicant's general inventive concept.

The invention claimed is:

1. A power measurement system, comprising:
   a voltage measurement circuit (VMC) configured to measure an input voltage, the VMC comprising:

a resistive network comprising first and second VMC resistors connected in series on a first single VMC substrate, the first VMC resistor having a resistance value larger than a resistance value of the second VMC resistor, the first VMC resistor being configured to receive the input voltage, and a first VMC feedback amplifier having an input in electrical communication with a point between the first and second VMC resistors, and an output in electrical communication with the second VMC resistor in a feedback configuration to output an attenuated VMC voltage signal; and a transresistance current measurement circuit (CMC) configured to measure an input primary current, the CMC comprising:

a current transformer to transform the input primary current into a secondary current, a plurality of CMC amplifiers configured in a cascading arrangement, and a CMC feedback resistor configured in parallel with the cascaded amplifiers such that the combined gain of the cascaded CMC amplifiers directs substantially all of the secondary current through the CMC feedback resistor;

wherein the power measurement system is configured to measure power based on a measured input voltage and a measured input primary current.

2. The system of claim 1, wherein the system is selectively switchable between high and low input voltage ranges in the VMC, and between high and low input current ranges in the CMC.

3. The system of claim 1, wherein the first and second VMC resistors are high-precision, low temperature coefficient (TC) resistors.

4. The system of claim 1, further comprising a housing configured such that the first single VMC substrate and first and second resistors are exposed to an outside of the housing.

5. The system of claim 1, wherein a resistance of the first VMC resistor is at least an order of magnitude larger than a resistance of the second VMC resistor.

6. The system of claim 1, wherein the plurality of CMC amplifiers include a first and second operational amplifier, an inverting input of the first CMC amplifier is in electrical communication with the current transformer, a non-inverting input of the second CMC amplifier is in electrical communication with the an output of the first CMC amplifier, a CMC output voltage signal is supplied at an output of the second amplifier, and a value of the secondary current is derived from the relationship of the CMC output voltage signal and resistive value of the CMC feedback resistor.

7. The system of claim 1, further comprising a differential in/out amplifier circuit (DIOAC) to convert output signals from the VMC and/or CMC to positive, differential, anti-aliased signals implemented on a dc reference voltage.

8. The system of claim 7, wherein the DIOAC comprises:
a DIOAC negative voltage input;
a DIOAC positive voltage input;
a DIOAC positive voltage output;
a DIOAC negative voltage output;
a first DIOAC amplifier having an output in electrical communication with the DIOAC positive voltage output;
a first DIOAC resistor in electrical communication with the DIOAC negative voltage input;
a second DIOAC resistor in electrical communication with the first DIOAC resistor and the DIOAC positive voltage output;
a third DIOAC resistor in electrical communication with the DIOAC positive voltage input;
a fourth DIOAC resistor in electrical communication with the third DIOAC resistor and the DIOAC negative voltage output;
wherein the first, second, third, and fourth DIOAC resistors are formed on a first single DIOAC substrate.

9. The system of claim 8, wherein the first and third DIOAC resistors have substantially the same resistance value, and the second and fourth DIOAC resistors have substantially the same resistance value.

10. The system of claim 8, wherein the DIOAC negative voltage input receives the VMC output voltage signal, and the DIOAC positive voltage input is in electrical connection with a ground of the VMC, when the system is in the voltage measurement mode; and the DIOAC negative voltage input receives the CMC output voltage signal, and the DIOAC positive voltage input is in electrical connection with a ground of the CMC, when the system is in the current measurement mode.

11. The system of claim 8, wherein the DIOAC further comprises:

a second DIOAC amplifier having an output in communication with the DIOAC negative voltage output;
a baseline voltage input in electrical communication with a positive input of the second DIOAC amplifier;
a fifth DIOAC resistor in electrical communication with the DIOAC negative voltage output and a negative input of the second DIOAC amplifier; and
a sixth DIOAC resistor in electrical communication with the DIOAC positive voltage output and the negative input of the second DIOAC amplifier;
wherein the fifth and sixth DIOAC resistors are formed on a second single DIOAC substrate.

12. The system of claim 8, wherein the DIOAC further comprises a differential low-pass signal filter to minimize anti-aliasing distortion in downstream ADC operation, the low-pass signal filter comprising:

first DIOAC capacitor in electrical communication with, at a first side, a ground of the DIOAC, and with, at a second side, a point between the first and second DIOAC resistors;
a second DIOAC capacitor in electrical communication with, at a first side, a negative input of the first DIOAC amplifier, and, at a second side, the DIOAC positive voltage output;
a seventh DIOAC resistor in electrical communication with, at a first side, the first DIOAC capacitor and the point between the first and second DIOAC resistors, and with, at a second side, the second DIOAC capacitor and the negative input of the first DIOAC amplifier;
a third DIOAC capacitor in electrical communication with, at a first side, the ground of the DIOAC, and with, at a second side, a point between the third and fourth DIOAC resistors;
a fourth DIOAC capacitor in electrical communication with, at a first side, a positive input of the first DIOAC amplifier, and, at a second side, the DIOAC negative voltage output; and
an eighth DIOAC resistor in electrical communication with, at a first side, the third DIOAC capacitor and the point between the third and fourth DIOAC resistors, and with, at a second side, the fourth DIOAC capacitor and the positive input of the first DIOAC amplifier;
wherein the first and third DIOAC capacitors have substantially the same capacitance values, the second and fourth DIOAC capacitors have substantially the same capacitance values, and the seventh and eighth DIOAC resistors have substantially the same resistance values.

13. The system of claim 1, further comprising:
a housing;
a plurality of user inputs to enter operation requests and/or data;
at least one display screen to display operation modes, operation results, stored/generated data, requests for information, or any combination thereof; and
a plurality of connection ports to connect the system with one or more other auxiliary devices.

14. The system of claim 13, wherein the connection ports include three pairs of inputs to connect to another device to acquire three-phase voltage and/or current signals.

15. The system of claim 13, wherein the connection ports include a plurality of USB ports.

\* \* \* \* \*